US012575128B2

(12) United States Patent
Lin et al.

(10) Patent No.: US 12,575,128 B2
(45) Date of Patent: Mar. 10, 2026

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Tzu-Ging Lin, Kaohsiung City (TW); Chun-Liang Lai, Hsinchu City (TW); Yun-Chen Wu, Hsinchu (TW); Shun-Hui Yang, Taoyuan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 686 days.

(21) Appl. No.: 17/810,581

(22) Filed: Jul. 1, 2022

(65) Prior Publication Data

US 2024/0006535 A1      Jan. 4, 2024

(51) Int. Cl.
*H10D 30/62*      (2025.01)
*H10D 30/01*      (2025.01)
*H10D 62/10*      (2025.01)
*H10D 64/01*      (2025.01)

(52) U.S. Cl.
CPC ..... *H10D 30/6215* (2025.01); *H10D 30/0243* (2025.01); *H10D 62/118* (2025.01); *H10D 64/018* (2025.01)

(58) Field of Classification Search
CPC .......... H10D 30/6215; H10D 30/0243; H10D 62/118; H10D 64/018; H10D 64/017; H10D 30/014; H10D 30/43; H10D 30/797; H10D 30/6735; H10D 30/6757; H10D 62/121; H10D 62/151; H10D 62/364; H10D 84/0151; H10D 84/038; H10D 84/83; B82Y 10/00
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 10,141,312 | B2 * | 11/2018 | Jeon et al. ........... H10D 84/038 |

(Continued)

*Primary Examiner* — Christine S. Kim
*Assistant Examiner* — Nathalie R Fayette
(74) *Attorney, Agent, or Firm* — WPAT LAW; Anthony King

(57) ABSTRACT

A semiconductor structure includes a substrate, a multi-gate FET device disposed over the substrate, a first isolation disposed in the substrate, and a second isolation disposed in the substrate. The multi-gate FET device includes a gate structure and epitaxial source/drain structures disposed at two sides of the gate structure. The first isolation includes a first portion and a second portion over the first portion. A top surface of the second portion is aligned with a top surface of the epitaxial source/drain structures. A width of the second portion is different from a width of the first portion.

20 Claims, 22 Drawing Sheets

(56)         References Cited

U.S. PATENT DOCUMENTS

| 10,665,669 | B1 * | 5/2020 | Xie et al. | ........... | H10D 84/0158 |
| 11,114,549 | B2 * | 9/2021 | Chen et al. | ............ | H10D 30/62 |
| 11,342,455 | B2 * | 5/2022 | Wang et al. | ......... | H10D 64/017 |
| 2020/0312956 | A1 * | 10/2020 | Yeh et al. | ............ | H10D 64/018 |

* cited by examiner

SEMICONDUCTOR STRUCTURE AND METHOD FOR FORMING THE SAME

BACKGROUND

As the semiconductor industry develops smaller and smaller nanoscale products and related processes in pursuit of greater device density, higher performance, and lower costs, challenges of downscaling both design and fabrication have led to development of three-dimensional designs, such as multi-gate field-effect transistors (FET), including a fin FET (FinFET) and a gate-all-around (GAA) FET. In a FinFET, a gate electrode is positioned adjacent to three side surfaces of a channel region with a gate dielectric layer interposed therebetween. Because such gate structure surrounds a fin on three sides, the FinFET essentially has three gates controlling a current through a fin or channel region. However, a fourth side, that is, a bottom part of the channel region, is positioned far away from the gate electrode and thus is not under close gate control. In contrast to a FinFET, a GAA FET includes an arrangement wherein all side surfaces of the channel region are surrounded by the gate electrode, allowing fuller depletion in the channel region and resulting in fewer short-channel effects due to a steeper sub-threshold current swing (SS) and smaller drain-induced barrier lowering (Min).

Although existing GAA FET devices and methods of fabricating GAA FET devices have been generally adequate for their intended purposes, such devices and methods have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
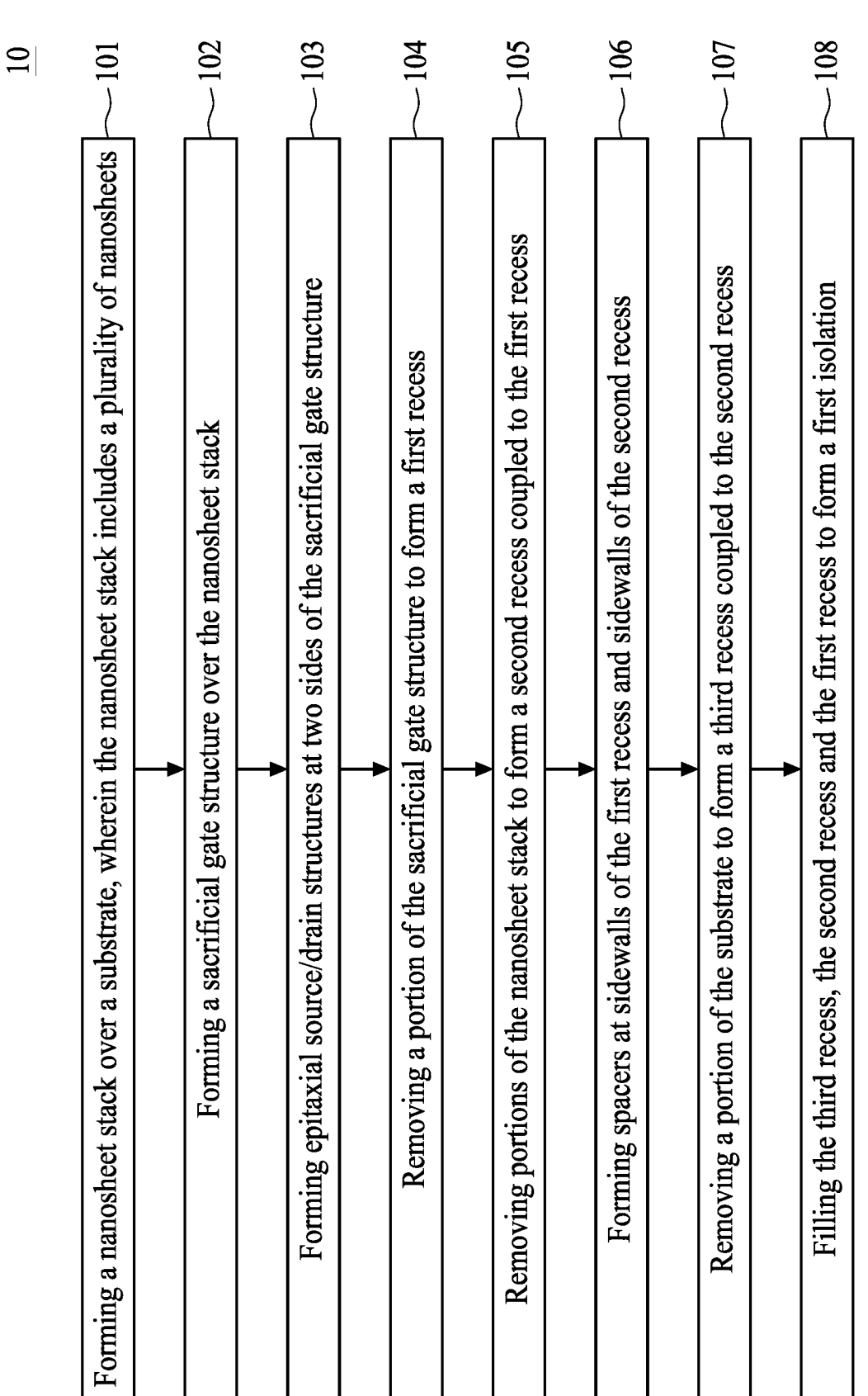
FIG. 1 is a flowchart representing a method for forming a semiconductor structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description, In the description of embodiments disclosed herein, any reference to direction or orientation is merely intended for convenience of description and is not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features, the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term "nanosheet" refers to atomic, molecular or macromolecular particles typically having a thickness in a range of approximately 1 to 100 nanometers and a width greater than the thickness. For example, the width may be at least twice the thickness, but the disclosure is not limited thereto. Typically, the novel and differentiating properties and functions of nanosheet components are observed or developed at a critical length scale of under 100 nm. In some embodiments, "nanosheet" components can also be referred to as "nano-slab," "nano-ring" or "multi-bridge channel" components.

It should also be noted that the embodiments described herein may be employed in the design and/or fabrication of any type of integrated circuit, or portion thereof, which may include any of a plurality of various devices and/or components such as a static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, Omega-gate ($\Omega$-gate) devices, or Pi-gate (II-gate) devices, as well as strained-semiconductor devices, silicon-on-insulator (SOI) devices, partially-depleted SOI (PD-SOI) devices, fully-depleted SOI (FD-SOI) devices, other memory cells, or other devices known in the art. One of ordinary skill may recognize other embodiments of semiconductor devices and/or circuits, including the design and fabrication thereof, which may benefit from aspects of the present disclosure.

A cut-OD operation is used to interrupt a continuous well region, and an isolation is subsequently formed, thereby obtaining one or more field-effect transistors (FETs) that form integrated circuits. It is found that when a well region is not completely interrupted, a leakage current may pass through a depletion region formed in the well region. In some comparative approaches, an over-etching may be performed to cut the well region (and a gate electrode) to obtain a desired depth. However, such approaches suffer from damages caused to stressors, which are usually formed by epitaxial semiconductor materials.

The present disclosure therefore provides a semiconductor structure and a method for forming the same. In some embodiments, the method includes modifying a recess profile formed in a cut-OD process in order to mitigate a leakage issue and reduce damage to an epitaxial material. In some embodiments, a sidewall spacer is provided to help control the recess profile formed in the cut-OD operation. The sidewall spacer further helps to protect the epitaxial material during the cut-OD operation. In some embodiments, the method provides an anisotropic etching to form the recess. Such anisotropic etching helps to form the recess having a desired depth with less consumption of sidewall materials. Accordingly, the leakage issue and the damage to the epitaxial material are both mitigated according to the method.

FIG. 1 is a flowchart representing a method for forming a semiconductor structure 10 according to aspects of the present disclosure. The method 10 includes a number of operations (101, 102, 103, 104, 105, 106, 107 and 108). The method 10 will be further described according to one or more embodiments. It should be noted that the operations of the method may be rearranged or otherwise modified within the scope of the various aspects. It should be further noted that additional processes may be provided before, during, and after the method and that some other processes may just be briefly described herein. Thus, other implementations are possible within the scope of the various aspects described herein.

FIGS. 2 to 5 and 6C are perspective views illustrating a semiconductor structure at various fabrication stages constructed according to aspects of one or more embodiments of the present disclosure. In some embodiments, in operation 101, a substrate 202 is received. The substrate 202 may be a semiconductor substrate such as a silicon substrate. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. The substrate 202 may include various layers, including conductive or insulating layers formed on a semiconductor substrate. The substrate 202 may include various doping configurations depending on design requirements as is known in the art. For example, different doping profiles (e.g., n wells or p wells) may be formed on the substrate 202 designed for different device types (e.g., n-type field effect transistors (NFET), or p-type field effect transistors (PFET)). The suitable doping may include ion implantation of dopants and/or diffusion processes. The substrate 202 has isolations, e.g., shallow trench isolations (STIs) 204, interposing the regions. Further, the substrate 202 may optionally include an epitaxial layer (epi-layer), may be strained for performance enhancement, may include an SOI structure, and/or may have other suitable enhancement features.

In some embodiments, a plurality of alternating semiconductor layers 206 and 208 are formed over the substrate 202. The alternating semiconductor layers 206 and 208 may be used to selectively process some of the layers. Accordingly, compositions of the semiconductor layers 206 and 208 may have different oxidation rates, etchant sensitivity, and/or other differing properties. The semiconductor layers 206 and 208 may have thicknesses chosen based on device performance considerations. In some embodiments, the semiconductor layers 206 are substantially uniform in thickness, and the semiconductor layers 208 are substantially uniform in thickness.

In some embodiments, either of the semiconductor layers 206 and 208 may include Si. In some embodiments, either of the semiconductor layers 206 and 208 may include other materials such as Ge, a compound semiconductor such as silicon carbide (SiC), gallium arsenide (GaAs), gallium phosphide (GaP), indium phosphide (InP), indium arsenide (InAs), and/or indium antimonide (InSb), an alloy semiconductor such as SiGe, GaAsP, AlInAs, AlGaAs, InGaAs, GaInP, and/or GaInAsP, or combinations thereof. In some embodiments, the semiconductor layers 206 and 208 may be undoped or substantially dopant-free, where, for example, no doping is performed during the epitaxial growth process. Alternatively, the semiconductor layers 206 and 208 may be doped. For example, the semiconductor layers 206 or 208 may be doped with a p-type dopant such as boron (B), aluminum (Al), In, and Ga for forming a p-type channel, or an n-type dopant such as F, As, Sb, for forming an n-type channel.

Figure 2:
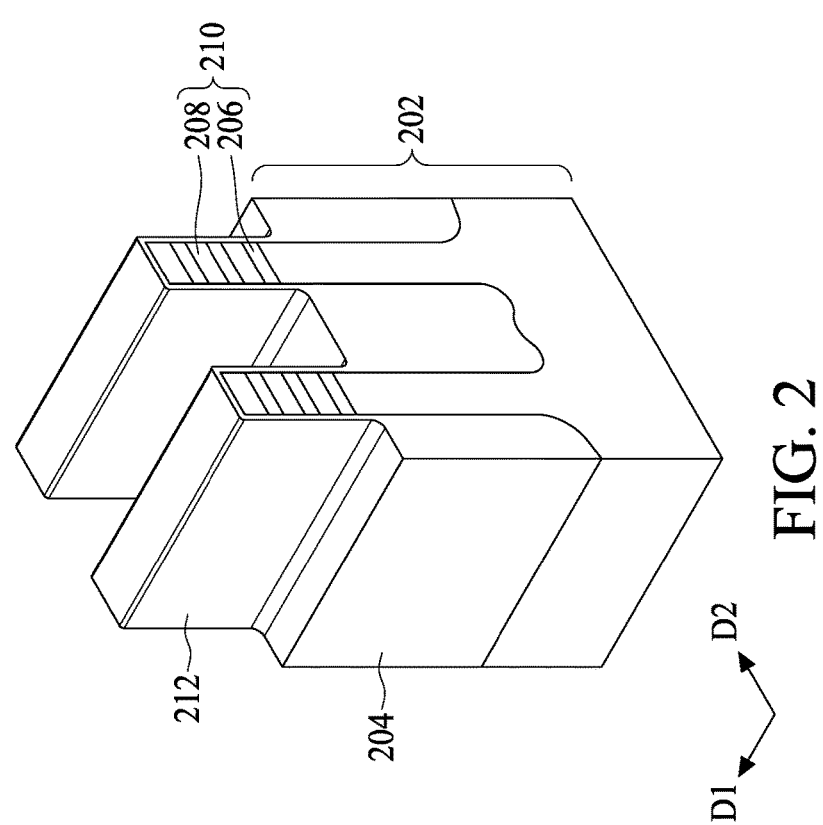

Still referring to FIG. 2, at least one nanosheet stack 210 is formed over the substrate 202 in operation 101. The nanosheet stack 210 may be fabricated using suitable operations including photolithography and etch operations. In some embodiments, the nanosheet stack 210 is also known as a fin. In some embodiments, forming the nanosheet stack 210 may further include a trim process to decrease the width and/or the height of the nanosheet stack 210. The trim process may include wet or dry etching processes. The height and width of the nanosheet stack 210 may be chosen based on device performance considerations. Further, the nanosheet stack 210 can extend along a first direction D1 as shown in FIG. 2. Additionally, the nanosheet stacks 210 are arranged in a second direction D2 which is not parallel with the first direction D1. Additionally, the first direction D1 and the second direction D2 are in the same plane. In some embodiments, a liner 212 can be formed over the nanosheet stack 210 and the substrate 202.

Figure 3:
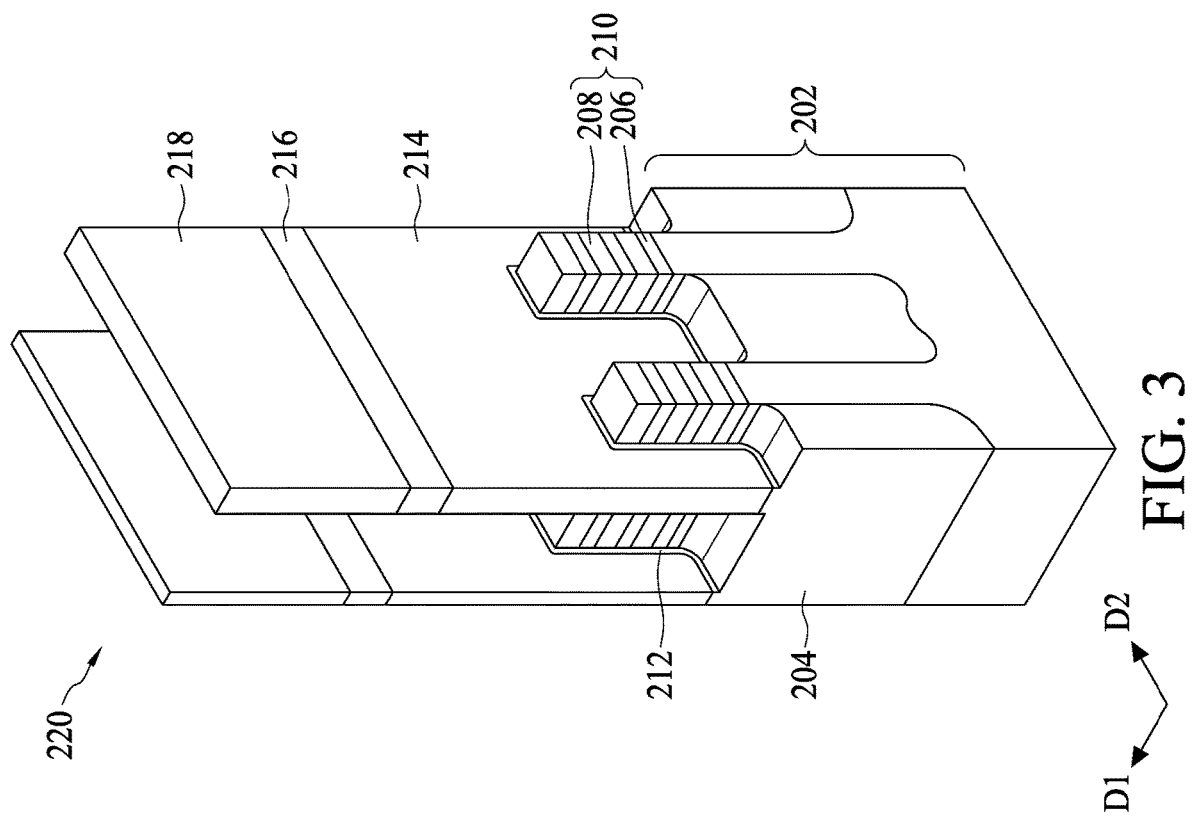
FIGS. 2 to 5 are perspective views of a semiconductor structure at various fabrication stages constructed according to aspects of one or more embodiments of the present disclosure.

Referring to FIG. 3, in operation 102, a sacrificial gate structure 220 is disposed over the nanosheet stack 210 and the substrate 202. In some embodiments, a polysilicon layer 214 is formed over the substrate 202 and the nanosheet stack 210. A patterned hard mask is formed over the polysilicon layer 214. In some embodiments, the patterned hard mask may be a patterned multiple hard mask. For example, the patterned multiple hard mask may include a first layer 216 and a second layer 218, but the disclosure is not limited thereto. In some embodiments, the first layer 216 and the second layer 218 may include different dielectric materials. The polysilicon layer 214 is patterned through the patterned hard mask 216/218 thereby forming the sacrificial gate structure 220. The sacrificial gate structure 220 may be replaced at a later processing stage by a metal gate electrode (MG) as discussed below. As shown in FIG. 3, the sacrificial gate structure 220 extends along the second direction D2. Additionally, the sacrificial gate structures 220 may be arranged along the first direction D1. Each of the sacrificial gate structures 220 is at least partially disposed over the nanosheet stack 210.

Figure 4:
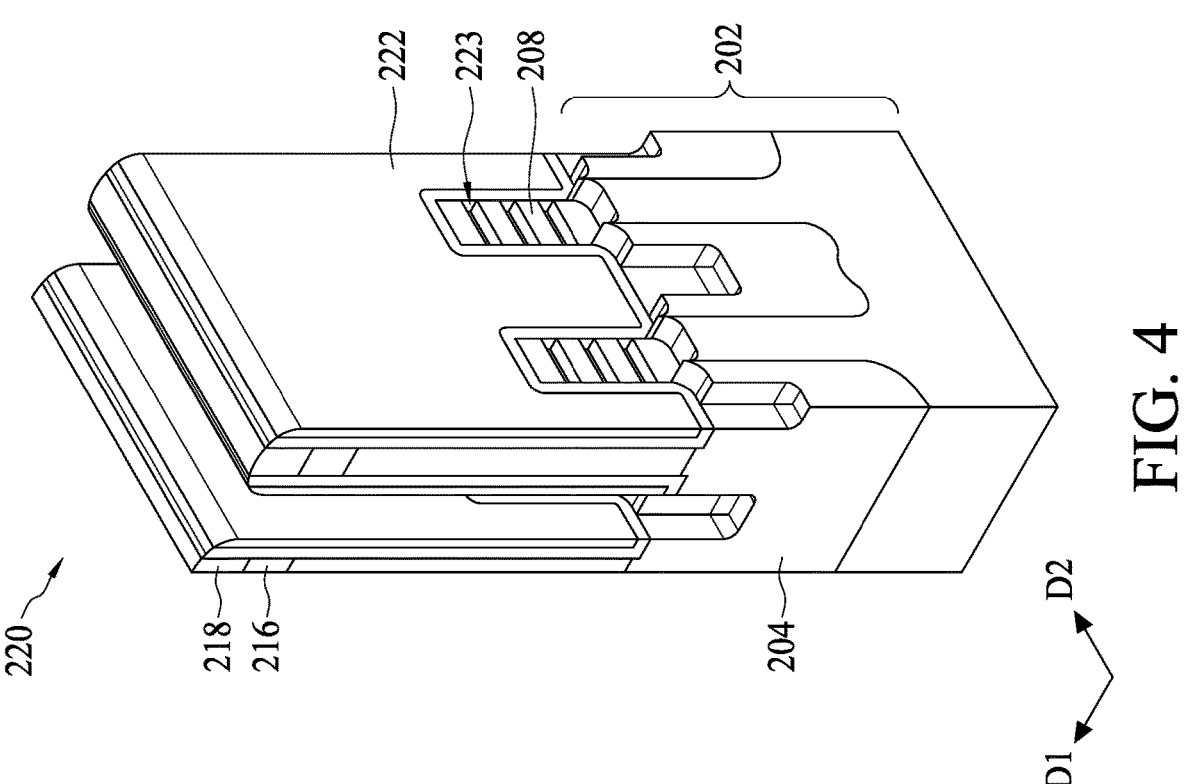

Referring to FIG. 4, in some embodiments, spacers 222 are formed over sidewalls of the sacrificial gate structures 220. In some embodiments, the spacers 222 are made of silicon nitride (SiN), silicon carbide (SiC), silicon oxide (SiO), silicon oxynitride (SiON), SiC or any suitable material, but the disclosure is not limited thereto. In some embodiments, the spacers 222 are formed by deposition and etch back operations.

Subsequently, portions of the nanosheet stack 210 exposed through the spacers 222 and the sacrificial gate structure 220 are removed. In some embodiments, the exposed semiconductor layers 206 of the nanosheet stack 210 are removed, and thus a plurality of notches 223 are formed between the remaining semiconductor layers 208, as shown in FIG. 4.

Figure 5:
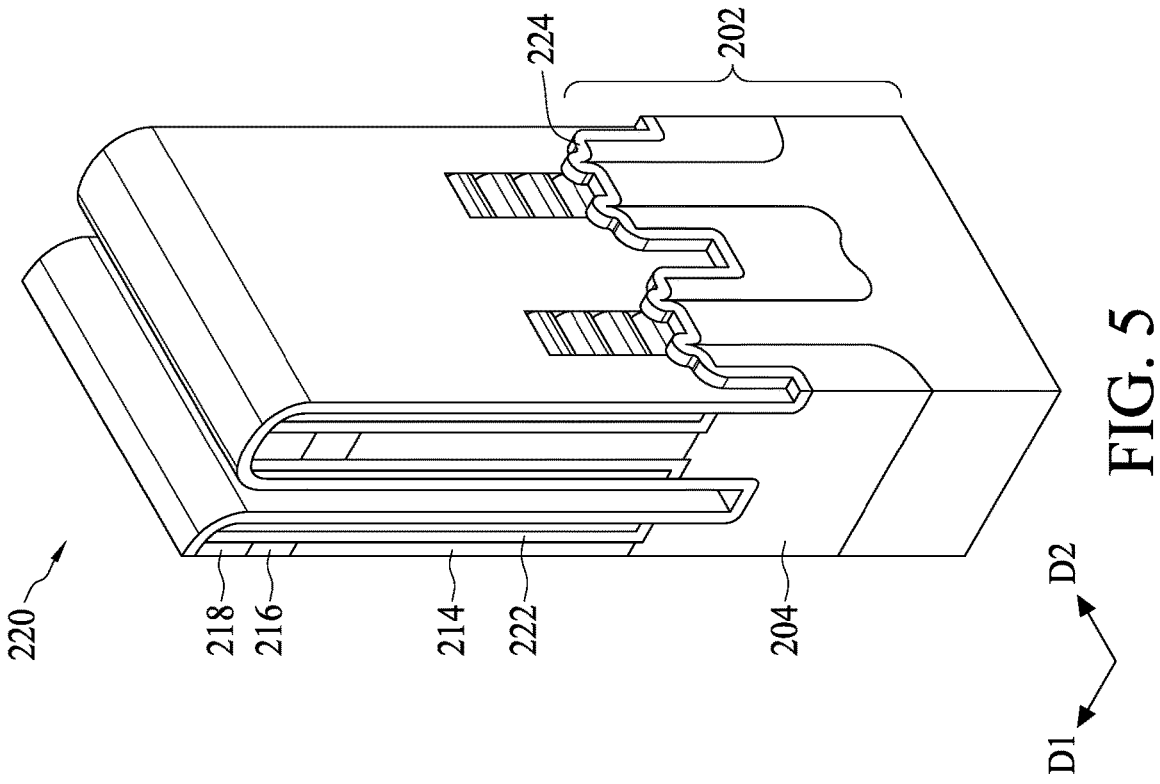

Referring to FIG. 5, in some embodiments, an insulating layer 224 is formed to fill the notches 223. Subsequently, portions of the insulating layer 224 may be removed, thereby forming inner spacers 226 (shown in FIG. 6B).

Figure 6B:
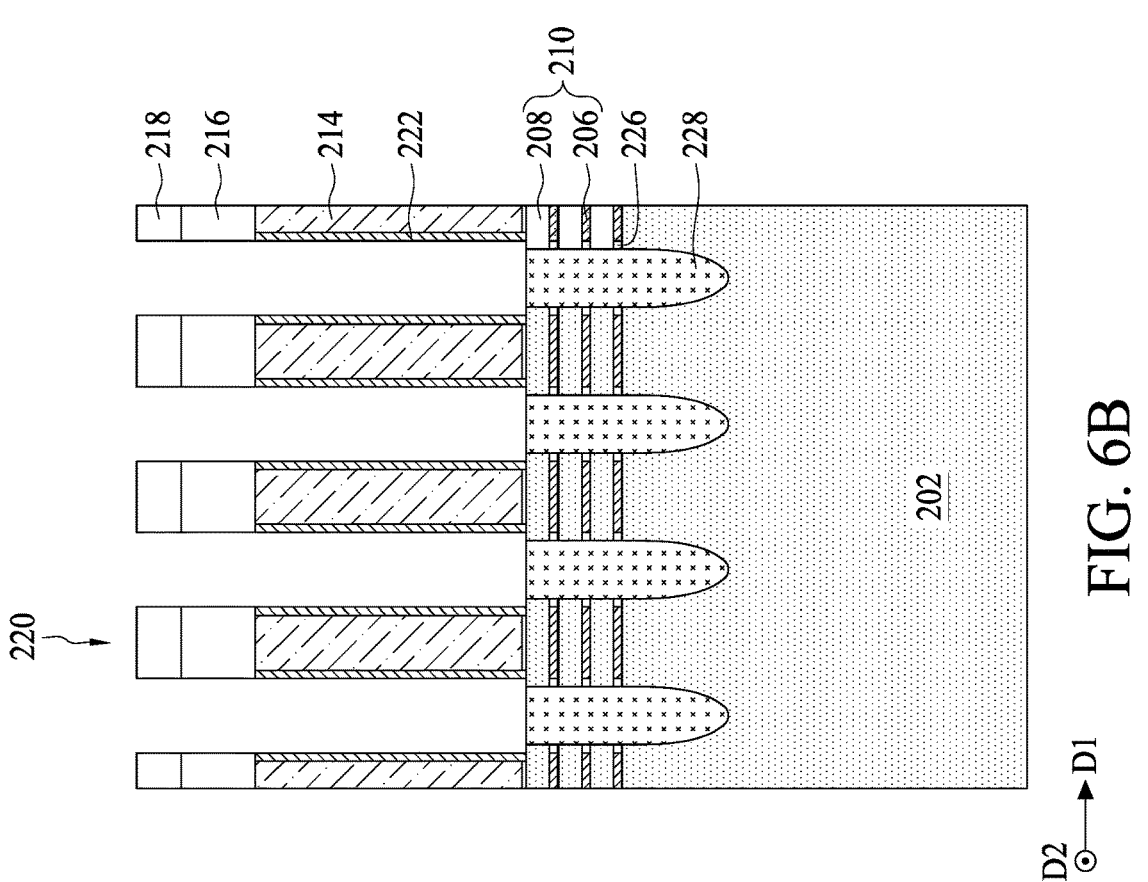
FIG. 6B is a cross-sectional view taken along line of FIG. 6C.
Figure 6A:
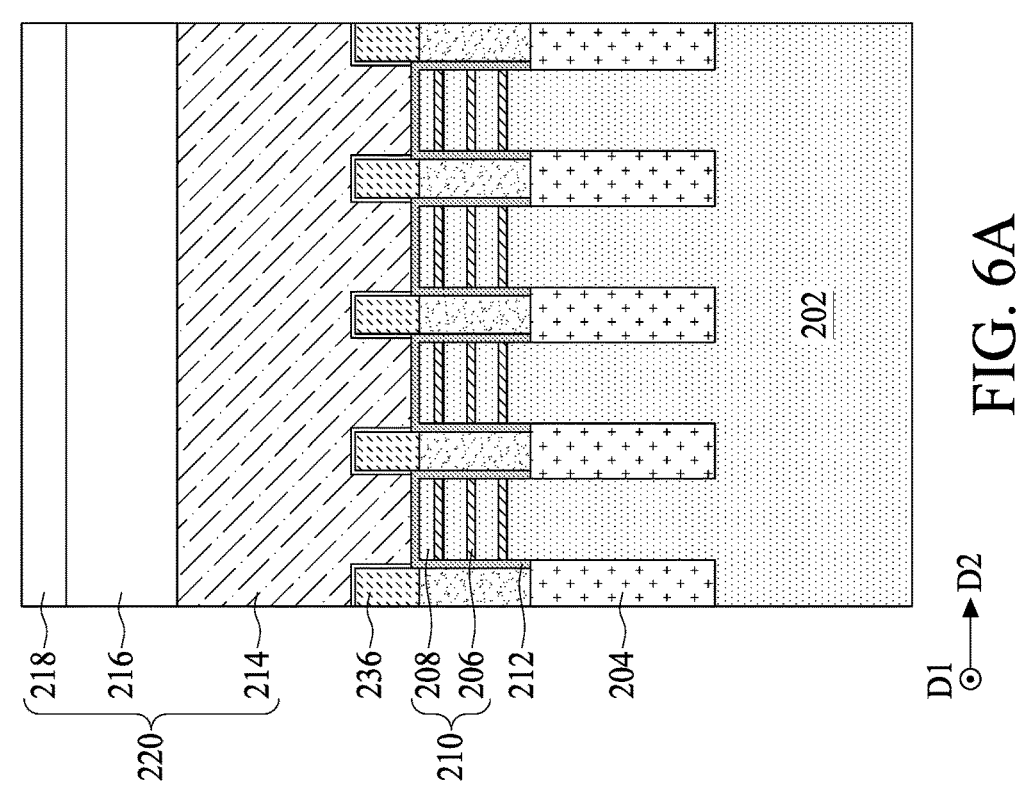
FIG. 6A is a cross-sectional view taken along line I-I' of FIG. 6C.
Figure 6C:
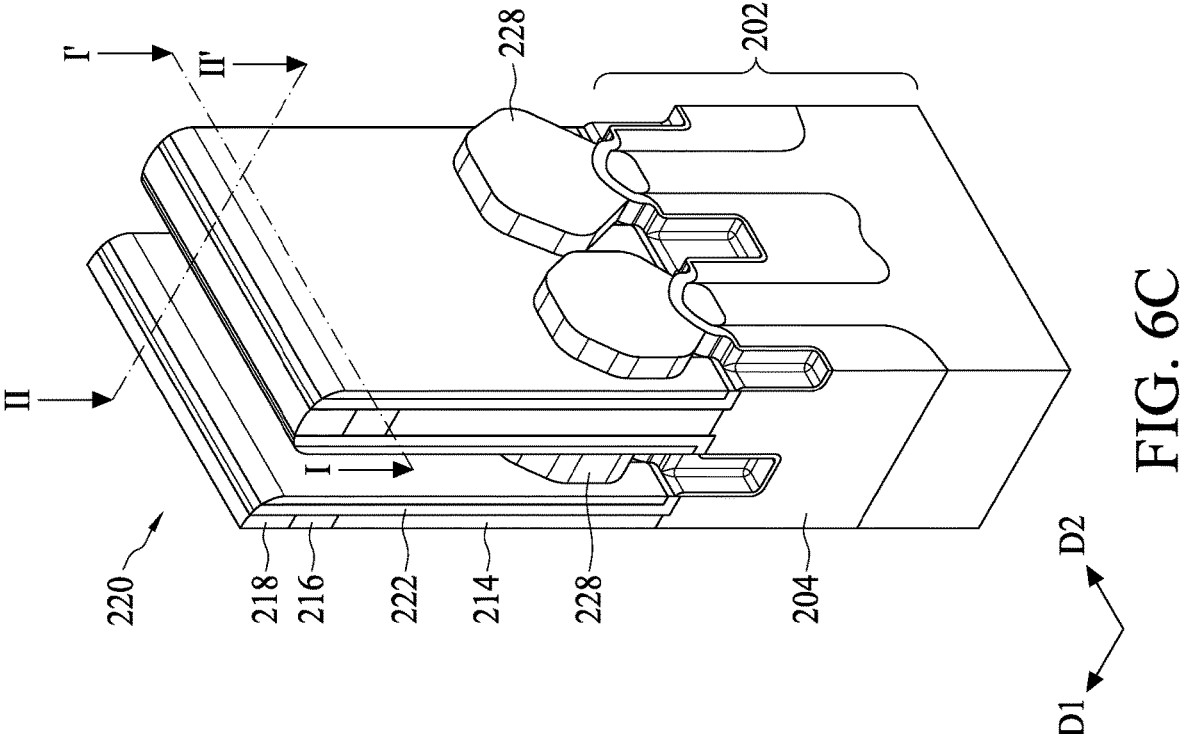
FIG. 6C is a perspective view of a semiconductor structure at a fabrication stage subsequent to that of FIG. 5.

Referring to FIGS. 6A to 6C, wherein FIG. 6C is a perspective view of a semiconductor structure at a fabrication stage subsequent to that of FIG. 5, FIG. 6A is a cross-sectional view taken along line I-I' of FIG. 6C, and FIG. 6B is a cross-sectional view taken along line II-II' of FIG. 6C. In operation 103, epitaxial source/drain structures 228 are formed at two sides of the sacrificial gate structure 220. The source/drain structures 228 may refer to a source or a drain, individually or collectively dependent upon the context. In some embodiments, the epitaxial source/drain structures 228 can be relatively higher than the nanosheet stack 210. In some embodiments, the epitaxial source/drain structures 228 are formed by forming recesses in the nanosheet stacks 210 and growing a strained material in the recesses by an epitaxial (epi) process. In addition, a lattice constant of the strained material may be different from a lattice constant of the substrate 202. Accordingly, the epitaxial source/drain structures 228 serve as stressors that improve carrier mobility.

In some embodiments, after the forming of the epitaxial source/drain structures 228, a contact etch-stop layer (CESL) 230 (shown in FIG. 12C) can be formed to cover the sacrificial gate structures 220 over the substrate 202. In some embodiments, the CESL 230 can include silicon nitride, silicon oxynitride, and/or other applicable materials. Subsequently, an inter-layer dielectric (ILD) layer 232 can be formed on the CESL 230 over the substrate 202 in accordance with some embodiments. The ILD layer 232 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Next, a polishing process is performed on the ILD layer 232, the CESL 230 and the patterned hard mask 216/218 to expose top surfaces of the polysilicon layer 214 of the sacrificial gate structures 220. In some embodiments, the ILD layer 232 and the CESL 230 are planarized by a chemical mechanical polishing (CMP) process until the top surfaces of the polysilicon layer 214 are exposed.

Figure 7B:
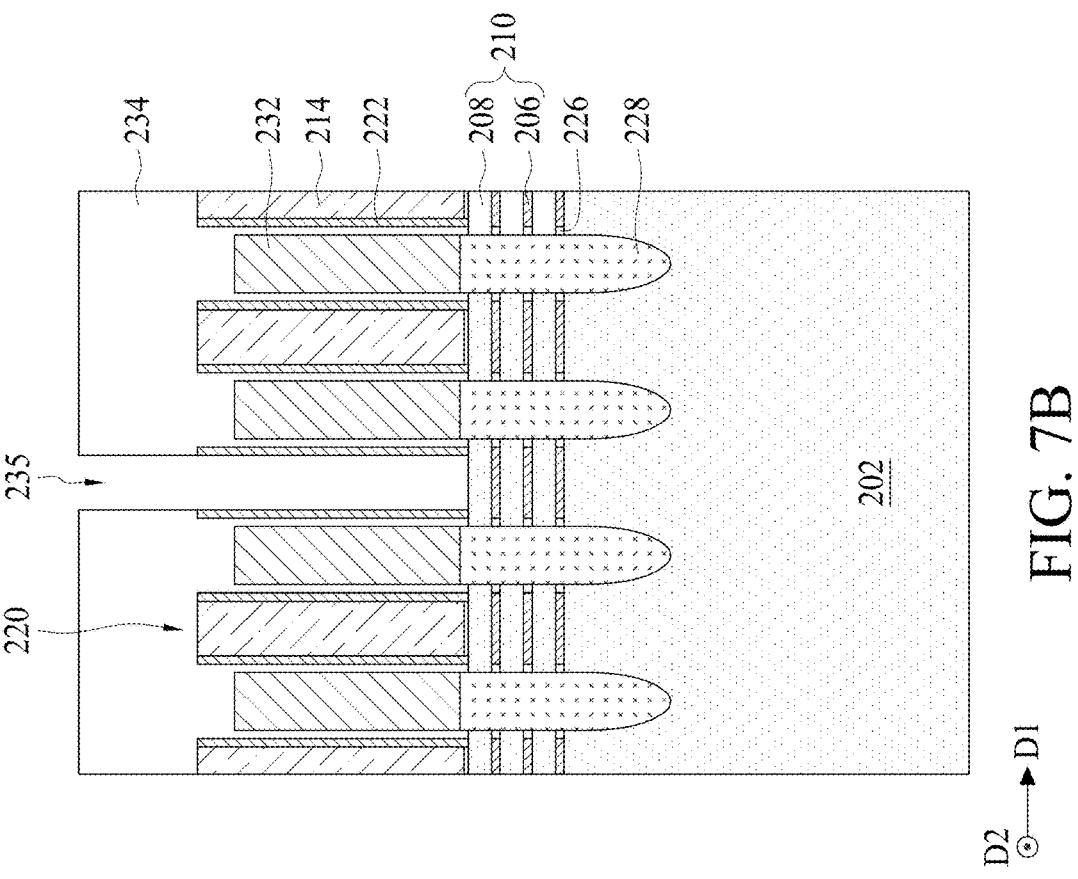
FIG. 7B is a cross-sectional view at a fabrication stage subsequent to that of FIG. 6B.
Figure 7A:
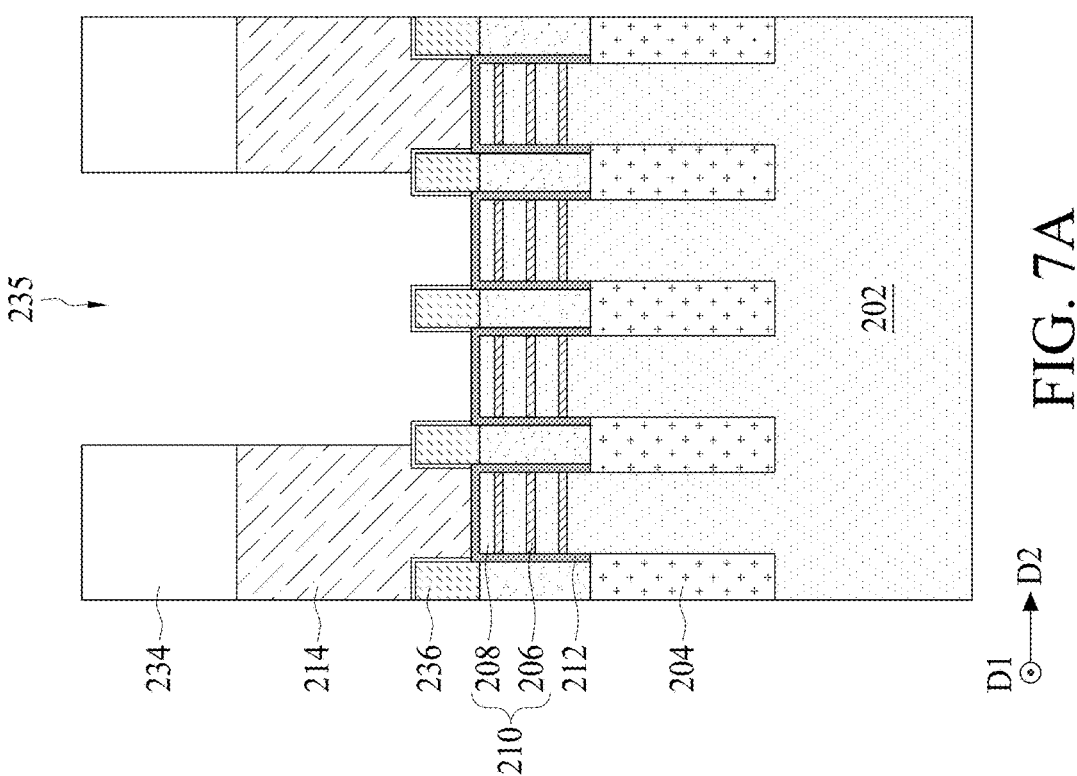
FIG. 7A is a cross-sectional view at a fabrication stage subsequent to that of FIG. 6A.

Referring to FIGS. 7A and 7B, in operation 104, a portion of the sacrificial gate structure 220 is removed to form a first recess 235. In some embodiments, a patterned hard mask 234 is formed over the exposed polysilicon layer 214. Next, an etching operation is performed to remove the portions of the polysilicon layer 214, thereby forming the first recess 235. In some embodiments, the first recess 235 may expose one or more of the nanosheet stacks 210, as shown in FIG. 7A. In such embodiments, top surfaces of the nanosheet stacks 210 are exposed though a bottom of the first recess 235.

In some embodiments, high-k dummy fins 236 may be formed between the nanosheet stacks 210. In such embodiments, the high-k dummy fins 236 is exposed through the first recess 235, as shown in FIG. 7A.

Figure 8B:
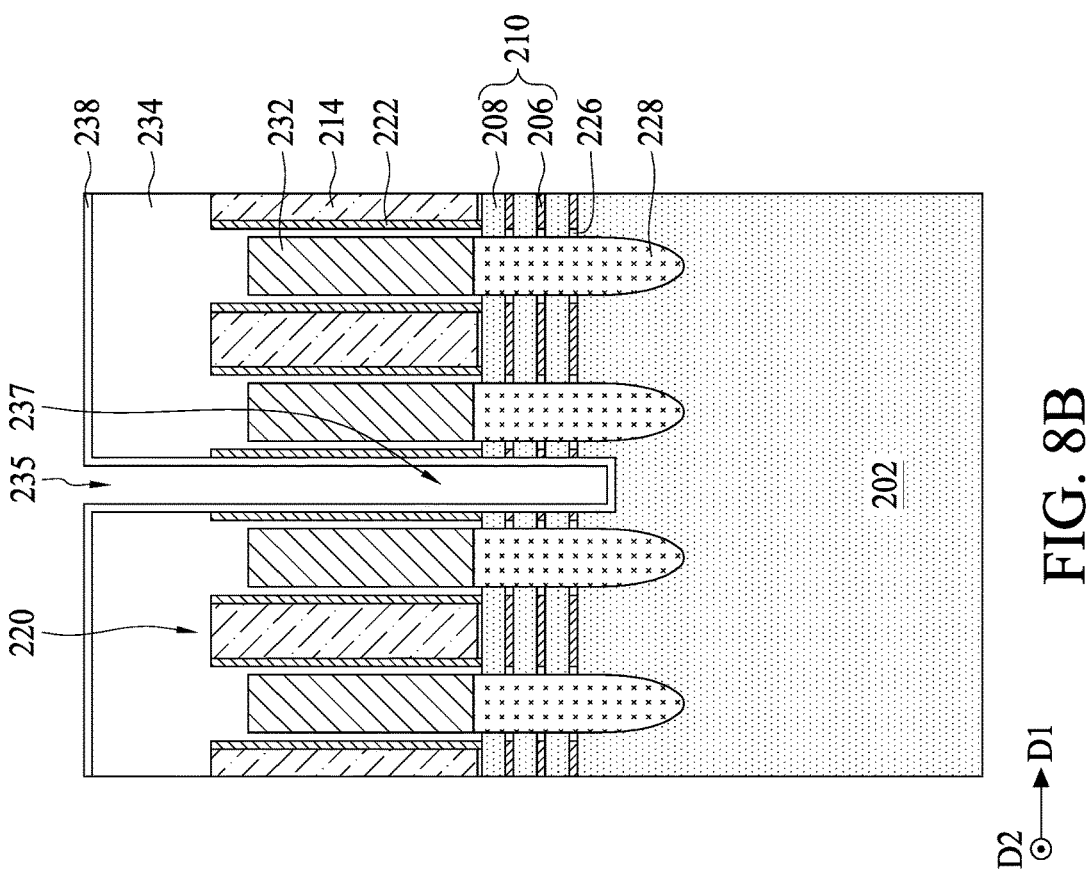
FIG. 8B is a cross-sectional view at a fabrication stage subsequent to that of FIG. 7B.
Figure 8A:
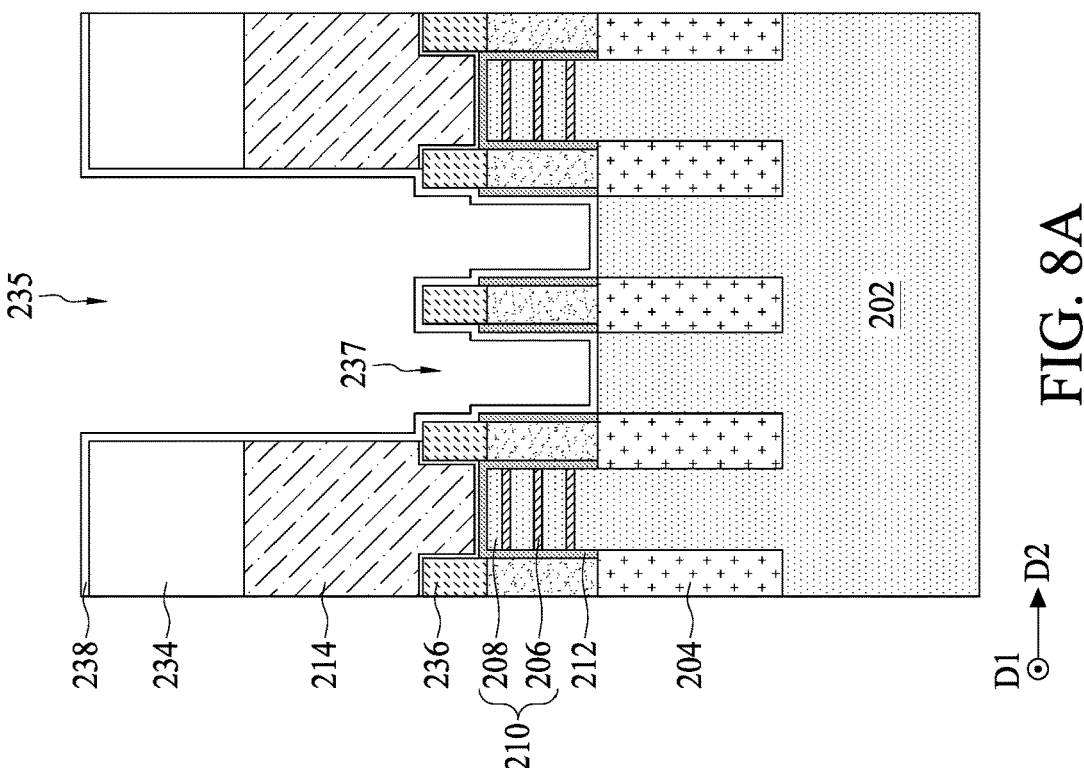
FIG. 8A is a cross-sectional view at a fabrication stage subsequent to that of FIG. 7A.

Referring to FIGS. 8A and 8B, in operation 105, portions of the nanosheet stack 210 are removed to form a second recess 237 coupled to the first recess 235. In some embodiments, the portions of the nanosheet stack 210 exposed through the bottom of the first recess 235 are removed. In some embodiments, the liner 212 covering the nanosheet stack 210 is removed prior to the removal of the portions of the nanosheet stack 210. In some embodiments, the removal of the liner 212 may be performed using carbon tetrafluoride (CF$_4$) and argon (Ar), but the disclosure is not limited thereto. In some embodiments, a flow rate of CF$_4$ is less than approximately 200 standard cubic centimeters per minute (sccm), and a flow rate of Ar is between approximately 100 sccm and approximately 1,000 sccm, but the disclosure is not limited thereto.

In some embodiments, the removal of the portions of the nanosheet stack 210 includes an anisotropic etching. For example but not limited thereto, the etching can include a dry etching. In some embodiments, the etching operation uses hydrogen bromide (HBr), oxygen (O$_2$) and argon (Ar), but the disclosure is not limited thereto. A flow rate of HBr is between approximately 100 sccm and approximately 1,000 sccm, a flow rate of O$_2$ is less than approximately 100 sccm, and a flow rate of Ar is between approximately 100 sccm and approximately 1,000 sccm, but the disclosure is not limited thereto.

Accordingly, the second recess 237 coupled to the bottom of the first recess 235 is obtained. In some embodiments, a portion of the substrate 202 may be exposed through a bottom of the second recess 237. In some embodiments, a depth of the second recess 237 is less than a depth of the epitaxial source/drain structures 228, as shown in FIG. 8B, but the disclosure is not limited thereto. In other words, the bottom of the second recess 237 is higher than bottoms of the epitaxial source/drain structures 228. In some embodiments, a width of the second recess 237 is less than a width of the nanosheet stack 210. In some embodiments, the inner spacer 226 may be exposed through sidewalls of the second recess 237, but the disclosure is not limited thereto.

In operation 106, spacers are formed on sidewalls of the first recess 235 and sidewalls of the second recess 237. In some embodiments, the forming of the spacers includes further operations. For example, referring to FIGS. 8A and 8B, in some embodiments, a protection layer 238 is conformally formed to cover the substrate 202. Thus, the protection layer 238 covers the sidewalls of the first recess 235 and the sidewalk of the second recess 237. Further, the protection layer 238 covers the bottom of the second recess 237, as shown in FIGS. 8A and 8B. In some embodiments, the protection layer 238 includes insulating material, but the disclosure is not limited thereto. Additionally, the protecting layer 238 covers the high-k dummy fin 236.

Figure 9B:
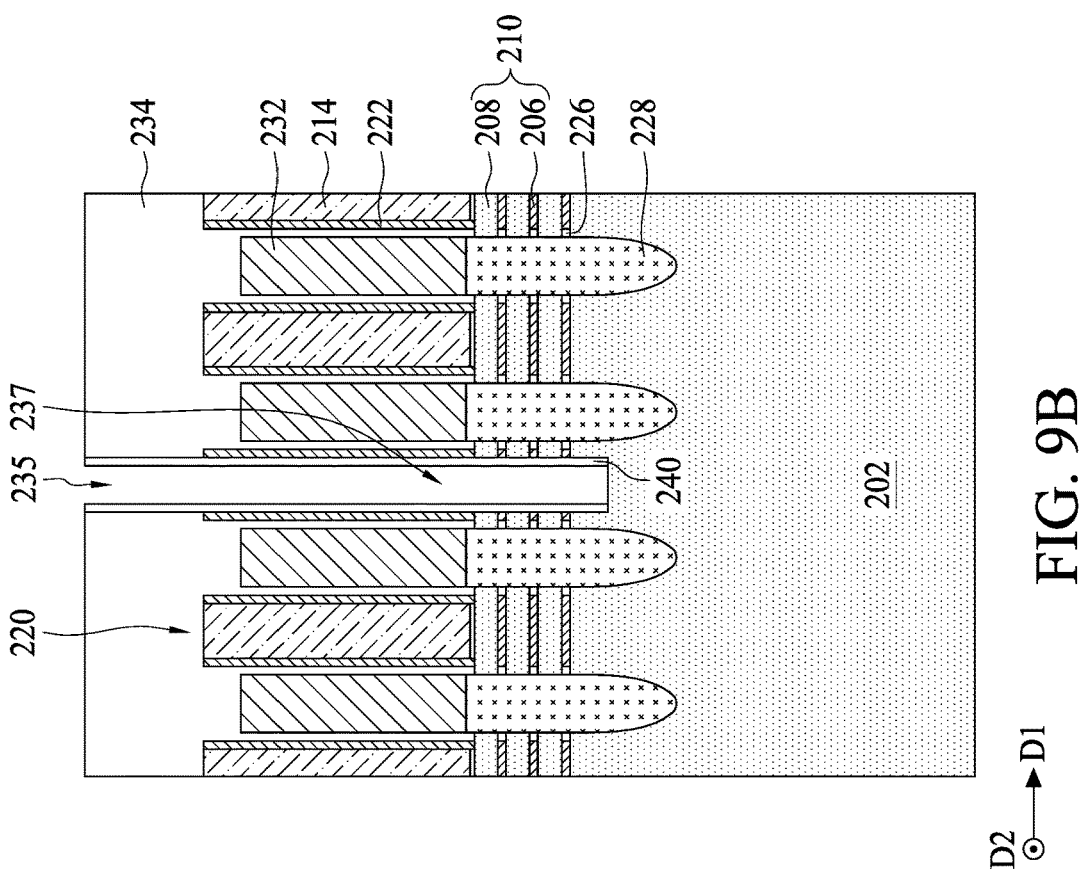
FIG. 9B is a cross-sectional view at a fabrication stage subsequent to that of FIG. 8B.
Figure 9A:
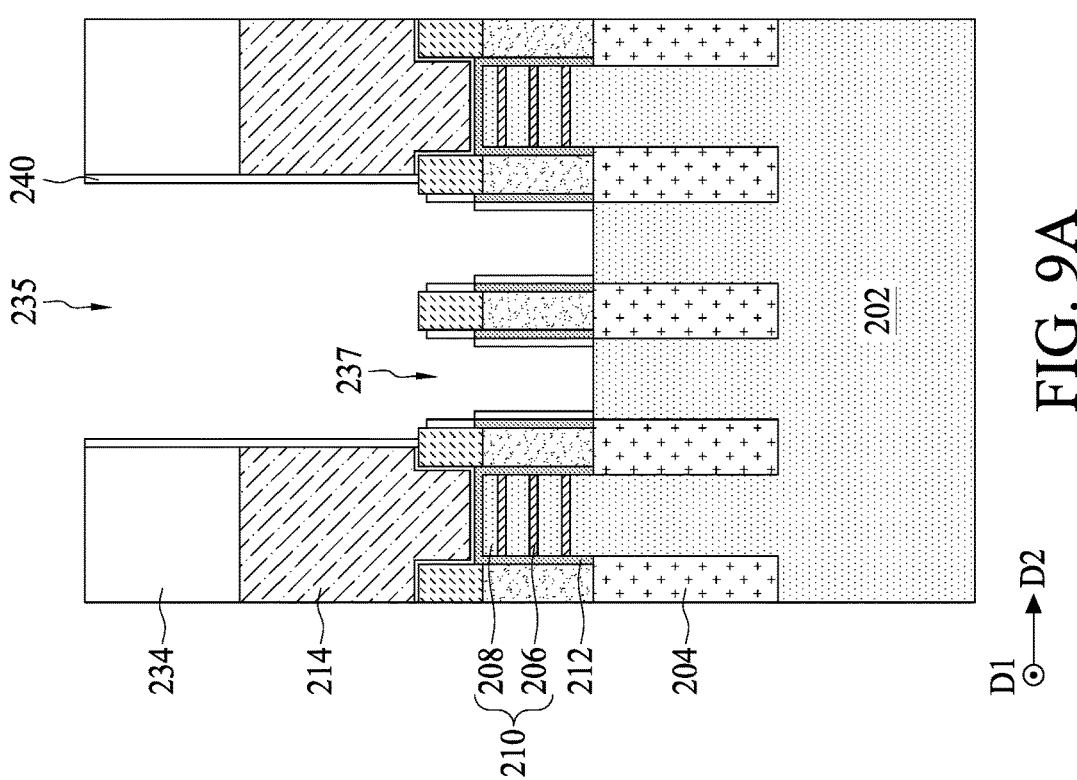
FIG. 9A is a cross-sectional view at a fabrication stage subsequent to that of FIG. 8A.

Referring to FIGS. 9A and 9B, in some embodiments, an etch back operation is performed to remove portions of the protection layer 238, thereby forming spacers 240 over the sidewalls of the first recess 235 and the sidewalls of the second recess 237. Accordingly, the substrate 202 is exposed again through the bottom of the second recess 237. In some embodiments, the etch back operation use CF$_4$ and Ar, but the disclosure is not limited thereto. In such embodiments, a flow rate of CF$_4$ is less than approximately 200 sccm, and a flow rate of Ar is between approximately 100 sccm and approximately 1,000 sccm, but the disclosure is not limited thereto.

Figure 10B:
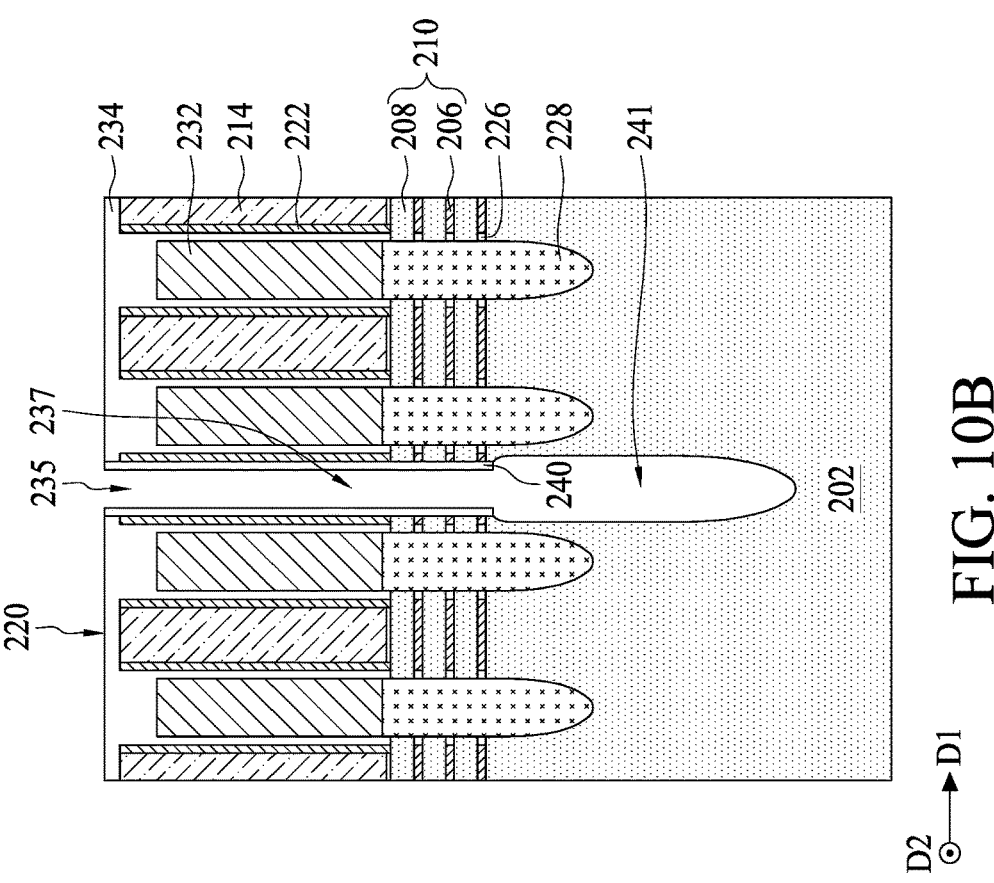
FIG. 10B is a cross-sectional view at a fabrication stage subsequent to that of FIG. 9B.
Figure 10A:
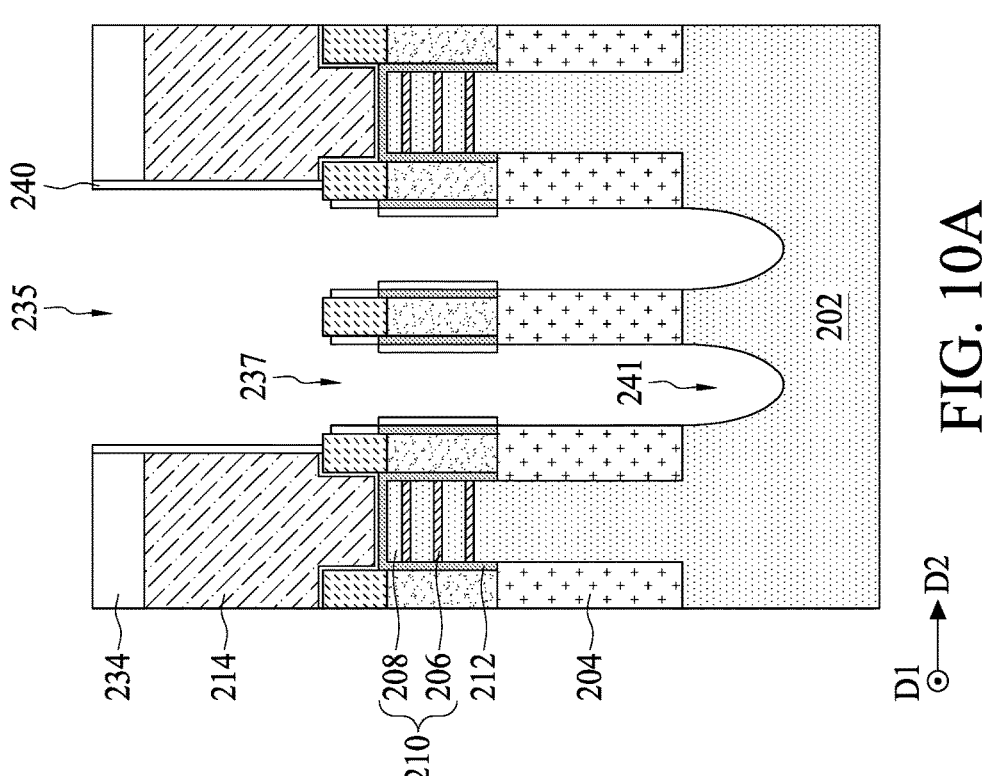
FIG. 10A is a cross-sectional view at a fabrication stage subsequent to that of FIG. 9A.

Referring to FIGS. 10A and 10B, in operation 107, portions of the substrate 202 are removed to form a third recess 241 coupled to the second recess 237. In some embodiments, the forming of the third recess 241 includes an anisotropic etching. In some embodiments, the etching is a dry etching operation. In some embodiments, the etching uses HBr, O$_2$ and Ar. A flow rate of HBr is between approximately 100 sccm and approximately 1,000 seem, a flow rate of O$_2$ is less than approximately 100 sccm, and a flow rate of Ar is between approximately 100 sccm and approximately 1,000 sccm, but the disclosure is not limited thereto. In some embodiments, the etching uses an inductively coupled plasma (ICP). In such embodiments, an RF frequency of the etching is approximately 13.56 MHz or approximately 27 MHz. An operation pressure may be between approximately 3 mTorr and approximately 150 mTorr. A temperature of the etching may be between approximately 20° C. and approximately 140° C. In some embodiments, an output of an RF power generator is controlled by a pulse signal having a duty cycle in a range of approximately 20% to approximately 100%. Additionally, an RF bias power to a pedestal in the process chamber is in a range of approximately 10 W to approximately 600 W. However, the abovementioned parameters are not limited thereto. Such parameters can be changed depending on different product and/or process designs.

As shown in FIGS. 10A and 10B, a bottom of the third recess 241 is lower than the bottoms of the epitaxial source/drain structures 228. Further, the bottom of the third recess 241 is lower than a bottom of the isolation 204. In some embodiments, a width of the third recess 241, a width of the second recess 237 and a width of the first recess 235 are different from each other. For example, the width of the second recess 237 may be less than the width of the first recess 235 and less than the width of the third recess 241. A depth of the third recess 241 is greater than the width of the third recess 241 due to the etching operation. It should be noted that during the etching operation, the bottom of the third recess 241 is made deeper than the isolation 204; however, less of a material of the sidewall is consumed. Therefore, the epitaxial source/drain structures 228 are separated from the third recess 241. Further, the sidewalk of the first and second recesses 235 and 237 are protected by the spacers 240. Therefore, the epitaxial source/drain structures 228 are protected from the etching.

After the forming of the third recess 241, a cleaning operation may be performed. The cleaning operation may use diluted hydrogen fluoride (dHF). The cleaning operation is performed to remove residues and/or by-products left from the forming of the third recess 241. In some embodiments, the spacer 240 is removed using the cleaning operation.

Figure 11B:
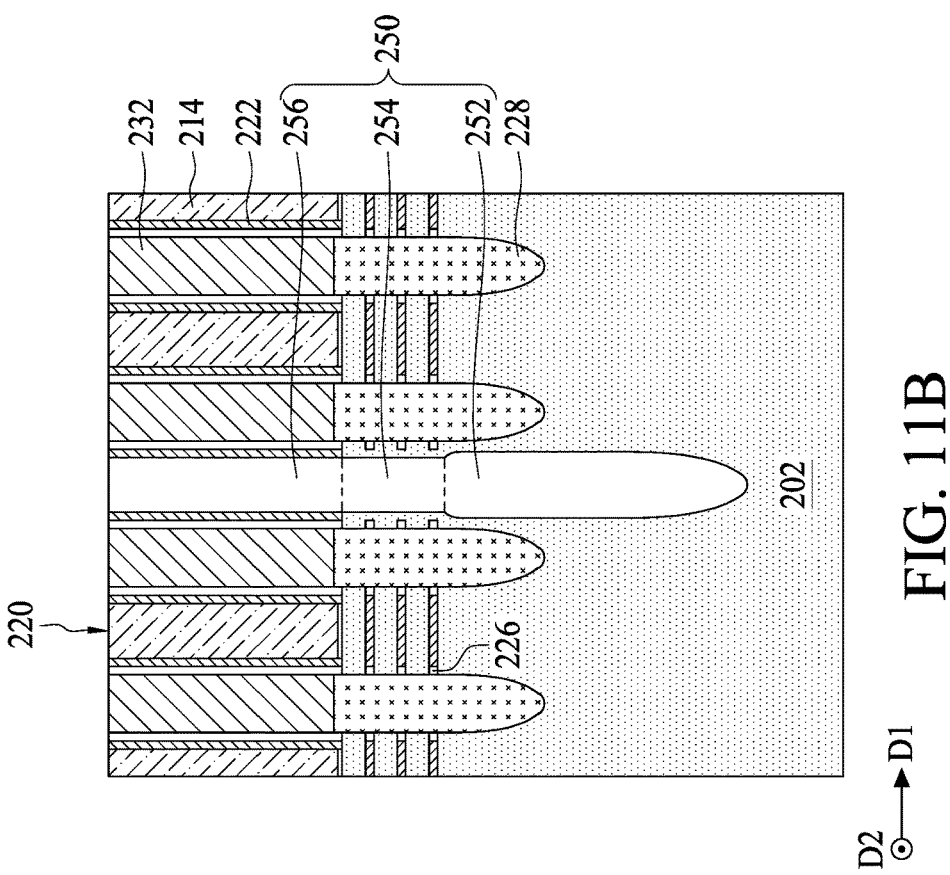
FIG. 11B is a cross-sectional view at a fabrication stage subsequent to that of FIG. 10B.
Figure 11A:
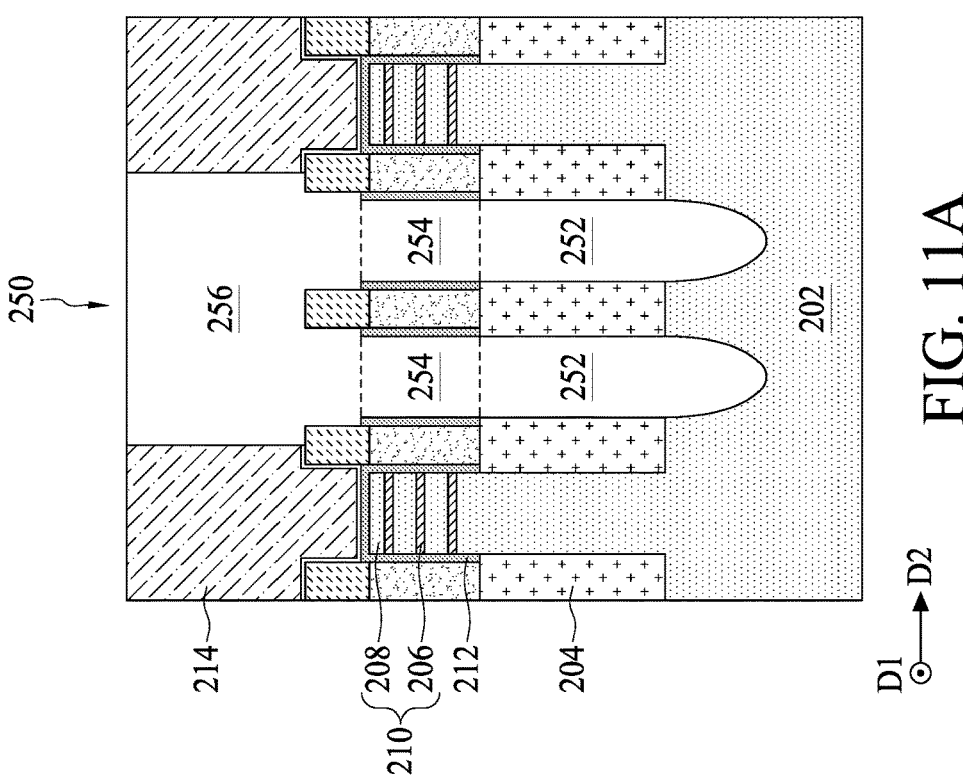
FIG. 11A is a cross-sectional view at a fabrication stage subsequent to that of FIG. 10A.

Referring to FIGS. 11A and 11B, in operation 108, the third recess 241, the second recess 237 and the first recess 235 are filled with an insulating material to form an isolation 250. In some embodiments, the insulating material may include silicon oxide, but the disclosure is not limited thereto. In some embodiments, the isolation 250 includes three portions: a first portion 252 filling the third recess 241, a second portion 254 filling the second recess 237, and a third portion 256 filling the first recess 235, The first portion 252, the second portion 254 and the third portion 256 are coupled. As shown in FIGS. 11A and 11B, a bottom of the first portion 252 is lower than the bottom of the isolation 204 and the bottoms of the epitaxial source/drain structures 228. Further, the bottoms of the epitaxial source/drain structures 228 are between the bottom of the first portion 252 and a bottom of the second portion 254. In some embodiments, a top of the second portion 254 may be aligned with a top surface of the epitaxial source/drain structures 228. However, in some embodiments, the top of the second portion 254 is lower than the top surface of the epitaxial source/drain structures 228.

As mentioned above, the widths of the first, second and third recesses 235, 237 and 241 are different from each other. Therefore, widths of the first, second and third portions 252, 254 and 256 of the isolation 250 are different from each other. For example, the width of the second portion 254 is less than the width of the first portion 252 and the width of the third portion 256. Therefore, the second portion 254 is referred to as a neck portion of the isolation 250. In some embodiments, the bottom and a lower portion of a sidewall of the first portion 252 are in contact with the substrate 202, while an upper portion of the sidewall of the first portion 252 is in contact with isolation 204. In some embodiments, the sidewalls of the second portion 254 may be in contact with the inner spacer 226 and the semiconductor layers 208. In some embodiments, a top surface of the third portion 256 is aligned with a top surface of the polysilicon layer 214 of the sacrificial gate structure 220. In some embodiments, sidewalls of the third portion 256 are in contact with the polysilicon layer 214.

In some embodiments, a planarization may be performed to remove superfluous insulating materials to form the isolation 250. In such embodiments, the patterned hard mask 234 may be removed by the planarization, thereby exposing a top surface of the sacrificial gate structure 220 (i.e., the polysilicon layer 214), as shown in FIG. 12.

After the exposing of the top surface of the sacrificial gate structures 220, the sacrificial gate structure 220 is removed to form a gate trench (not shown). In such embodiments, the nanosheet stack 210 is exposed through the gate trench. Subsequently, portions of the nanosheet stack 210 (i.e. the semiconductor layers 206) are removed to form a plurality of nanosheets 208. The nanosheets 208 are separated from each other. In some embodiments, trimming operations may be performed to adjust a width and a thickness of each nanosheet 208. By adjusting the width and the thickness of the nanosheets 208, a threshold voltage (Vt) of the FET device to be formed can be adjusted to meet requirements.

In some embodiments, an interfacial layer (IL) (not shown) is formed to surround each of the nanosheets 208 exposed in the gate trench. After the forming of the IL, a high-k gate dielectric layer 262 is formed to surround and enclose each of the nanosheets 208. In some embodiments, the high-k gate dielectric layer 262 includes a high-k dielectric material having a high dielectric constant, for example, a dielectric constant greater than that of thermal silicon oxide ($^{\sim}$3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride (HfOxNy), other suitable metal-oxides, or combinations thereof. The IL formed between the high-k gate dielectric layer 262 and each of the nanosheets 208 may include an oxide-containing material such as SiO or SiON, but the disclosure is not limited thereto.

In some embodiments, a work function metal layer 264 is formed to surround each of the nanosheets 208. Further, the work function metal layer 264 is formed on the high-k gate dielectric layer 262. In some embodiments, the work function metal layer 264 is an n-type work function metal layer. By selecting a metal material and adjusting a thickness of the work function metal layer 264, Vt of the n-type FET device can be adjusted to meet the requirement. In some embodiments, the n-type work function metal layer may include TaAl, TiAlC, TiAl(Si)C, TaAlC or TaSiAlC, but the disclosure is not limited thereto. In some embodiments, the work function metal layer 264 is a p-type work function metal layer. By selecting the metal material and adjusting a thickness of the work function metal layer 264, Vt of the p-type FET device can be adjusted to meet the requirement. In some embodiments, the p-type work function metal layer may include TaN, TiN, TSN, Mo or WCN, but the disclosure is not limited thereto. In some embodiments, the work function metal layer 264 can include a single layer or a multilayer of two or more of these materials. In some embodiments, at least a barrier metal layer (not shown) may be formed prior to or after the forming of the work function metal layer 264. The barrier metal layer can include, for example but not limited thereto, TiN.

Figure 12B:
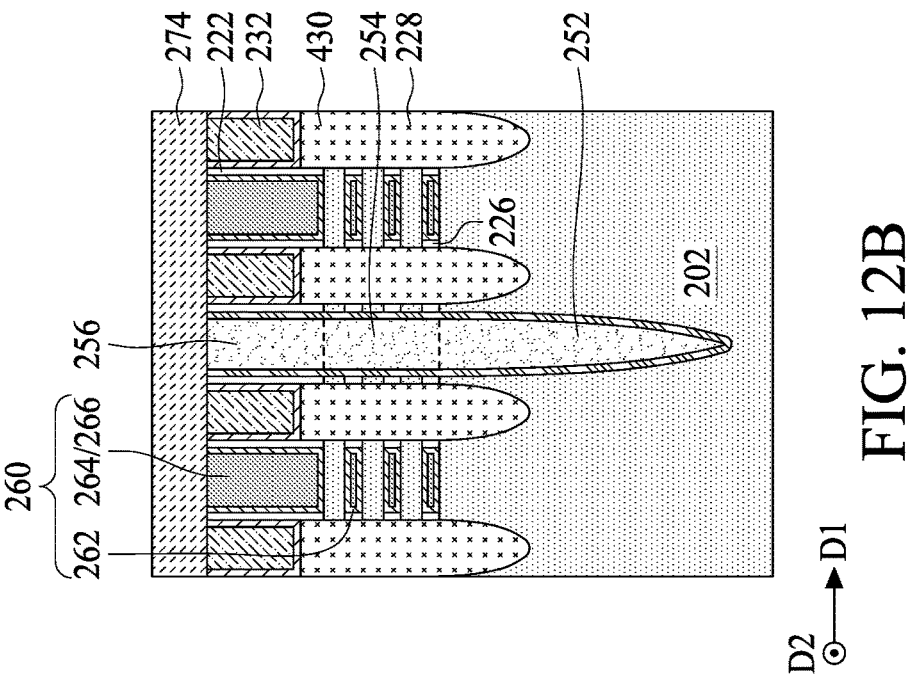
FIG. 12B is a cross-sectional view at a fabrication stage subsequent to that of FIG. 11B and a cross-sectional view taken along line II-II' of FIG. 12C.
Figure 12A:
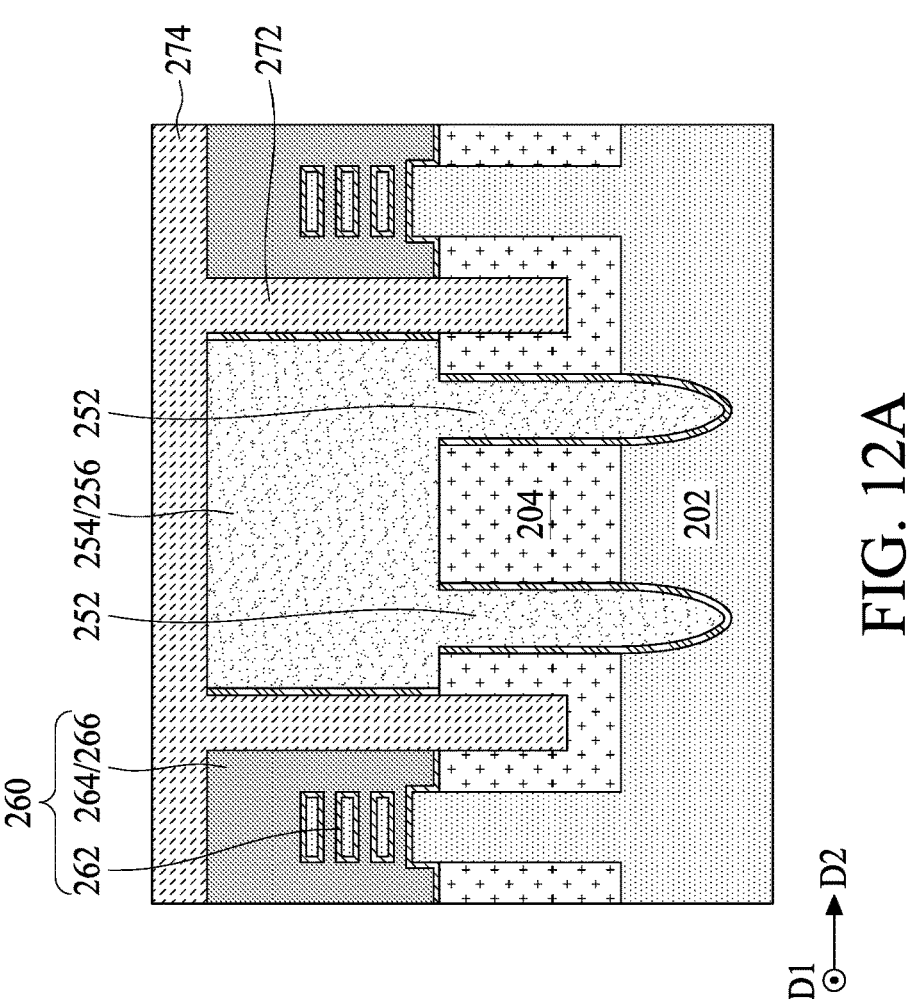
FIG. 12A is a cross-sectional view at a fabrication stage subsequent to that of FIG. 11A and a cross-sectional view taken along line I-I' of FIG. 12C.
Figure 12C:
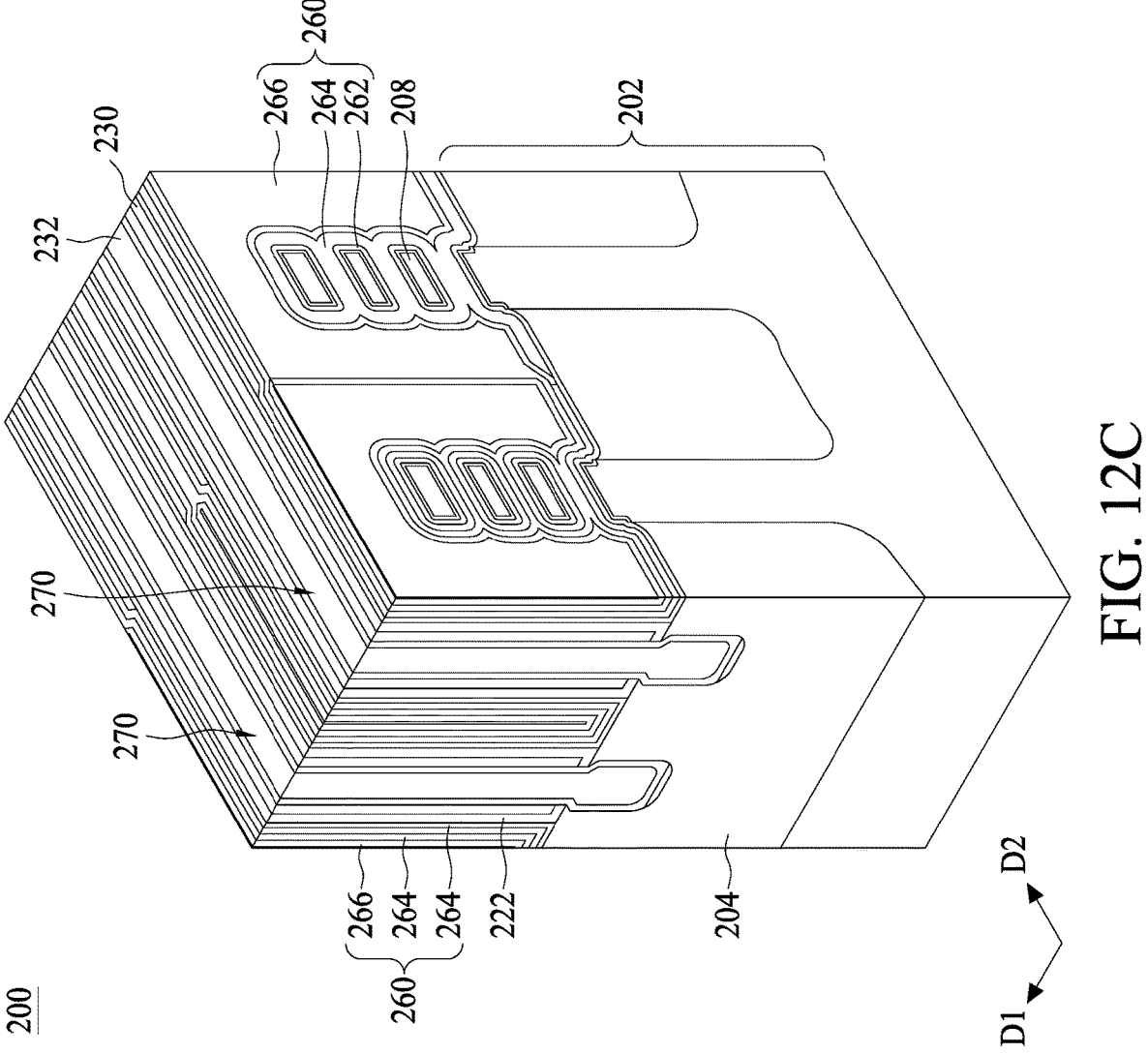

In some embodiments, a gap-filling metal layer 266 is formed to fill the gate trench, and a planarization operation is performed to remove superfluous material. Accordingly, a metal gate structure 260 is obtained, as shown in FIGS. 12A to 12C. Further, multi-gate FET devices 270 are obtained. The isolation 250 helps electrically isolate the multi-gate FET devices 270 from each other by interrupting the metal gate structures 260 and protruding into the substrate 202. Therefore, the isolation 250 can be referred to as a cut-OD isolation.

Accordingly, a semiconductor structure 200 is obtained. The semiconductor structure 200 includes a substrate 202, an isolation 204 disposed in the substrate 202, a multi-gate field effect transistor (FET) device 270 disposed over the substrate 202, and an isolation 250 disposed in and over the substrate 202. The multi-gate FET device 270 includes a metal gate structure 260, a plurality of nanosheets 208 and epitaxial source/drain structures 228. The nanosheets 208 are stacked over the substrate 202 and separated from each other by the metal gate structure 260, as shown in FIGS. 12A to 12C.

The isolation 250 includes a first portion 252, a second portion 254 and a third portion 256. As mentioned above, a width of the second portion 254 is different from a width of the first portion 252 and a width of the third portion 256, as shown in FIGS. 12A and 12B. A bottom of the first portion 252 of the isolation 250 is lower than a bottom of the isolation 204 and bottoms of the epitaxial source/drain structures 228. Further, the bottoms of the epitaxial source/drain structures 228 are between the bottom of the first portion 252 and a bottom of the second portion 254 of the isolation 250. In some embodiments, spacers 240 are disposed on sidewalls of the second portion 254 and sidewalk of the third portion 256 of the isolation 250. However, in some embodiments, the spacers 240 may be removed.

As mentioned above, the bottom of the first portion 252 of the isolation 250 is lower than the bottom of the isolation 204 and the bottoms of the epitaxial source/drain structures 228. In other words, a depth of the first portion 252 of the isolation 250 is great enough to penetrate well regions (not shown) formed in the substrate 202. Therefore, the first portion 252 provides sufficient electrical isolation and thus a leakage issue of the semiconductor structure 200 is mitigated. Further, due to the anisotropic etching used to form a third recess 241, the third recess 241 obtains a large depth-to-width ratio with less consumption of its sidewall materials. Thus, damage to the epitaxial source/drain structures 228 is mitigated.

Additionally, in some embodiments, when the high-k dummy tins 236 are not formed between the nanosheets stacks 210, the second portion 254 and the third portion 256 may be referred to as one portion that coupled to the first portion 252, as shown in FIG. 12A.

Further, in some embodiments, an isolation 272 may be formed to segment the metal gate structure 260. In some embodiments, the isolation 272 may be referred to as a cut-metal isolation structure. Further, a protection layer 274 may be formed over the metal gate structures 260 and the isolations 272. In some embodiments, the protection layer 274 is coupled to the isolations 272, but the disclosure is not limited thereto. In some embodiments, the isolation 272 includes silicon nitride, but the disclosure is not limited thereto. In some embodiments, the protection layer 274 includes silicon nitride, but the disclosure is not limited thereto. The isolation 272 and the protection layer 274 may include a same material. Alternatively, the isolation 272 and the protection layer 274 include different materials.

Figure 13:
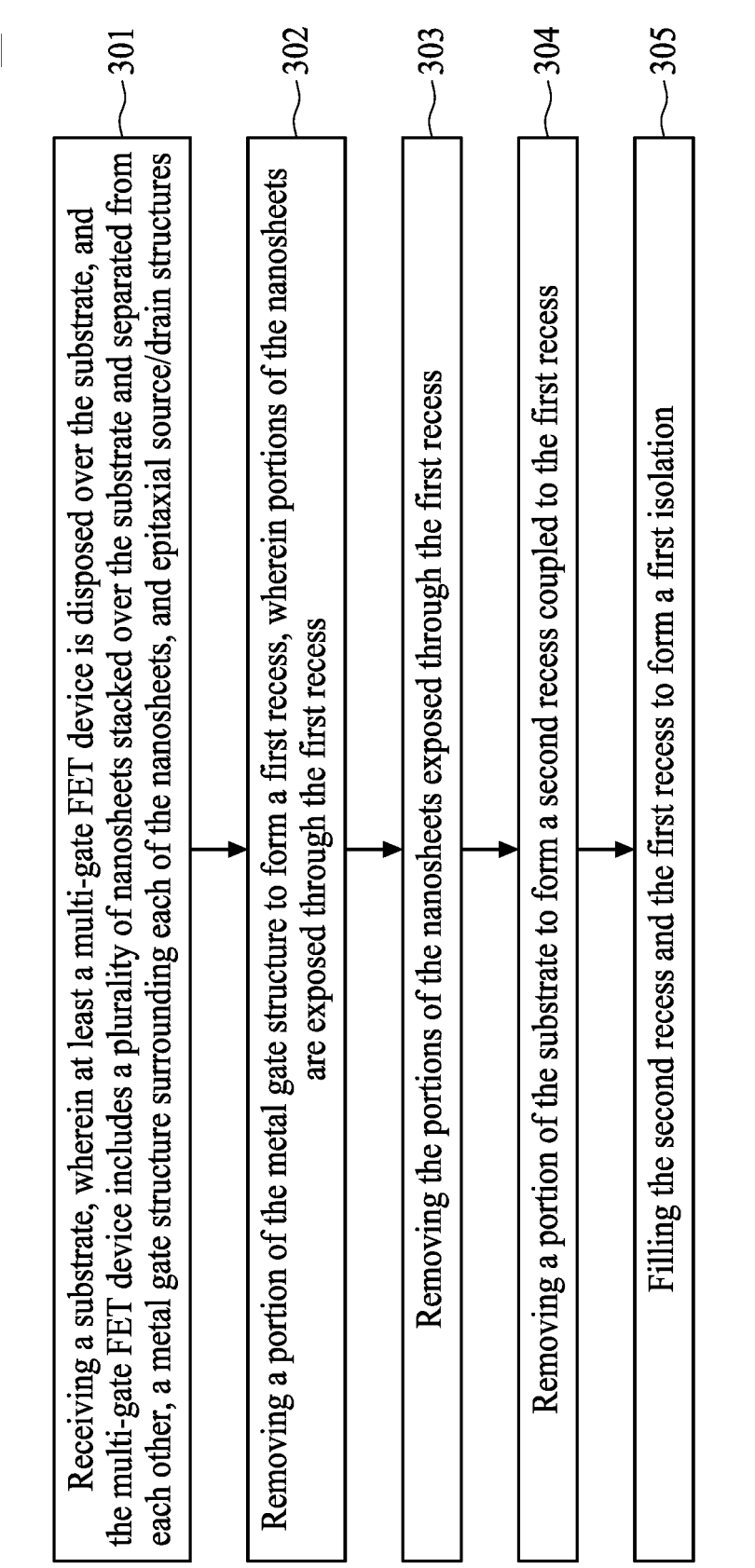
FIG. 13 is a flowchart representing a method for forming a semiconductor structure according to aspects of the present disclosure.

FIG. 13 is a flowchart representing a method for forming a semiconductor structure according to aspects of the present disclosure. The method 30 includes a number of operations (301, 302, 303, 304 and 305). The method 30 will be further described according to one or more embodiments. It should be noted that the operations of the method 30 may be rearranged or otherwise modified within the scope of the various aspects. It should be further noted that additional processes may be provided before, during, and after the method 30, and that some other processes may be only briefly described herein. Thus, other implementations are possible within the scope of the various aspects described herein.

FIGS. 14A to 21B are schematic views illustrating a semiconductor structure at various fabrication stages constructed according to aspects of one or more embodiments of the present disclosure. It should be understood that FIGS. 14A to 21B have been simplified for a better understanding of the inventive concepts of the present disclosure. Accordingly, it should be noted that additional processes may be provided before, during, and after the processes shown in FIGS. 14A to 21B, and that some other operations may only be briefly described herein.

Figure 14B:
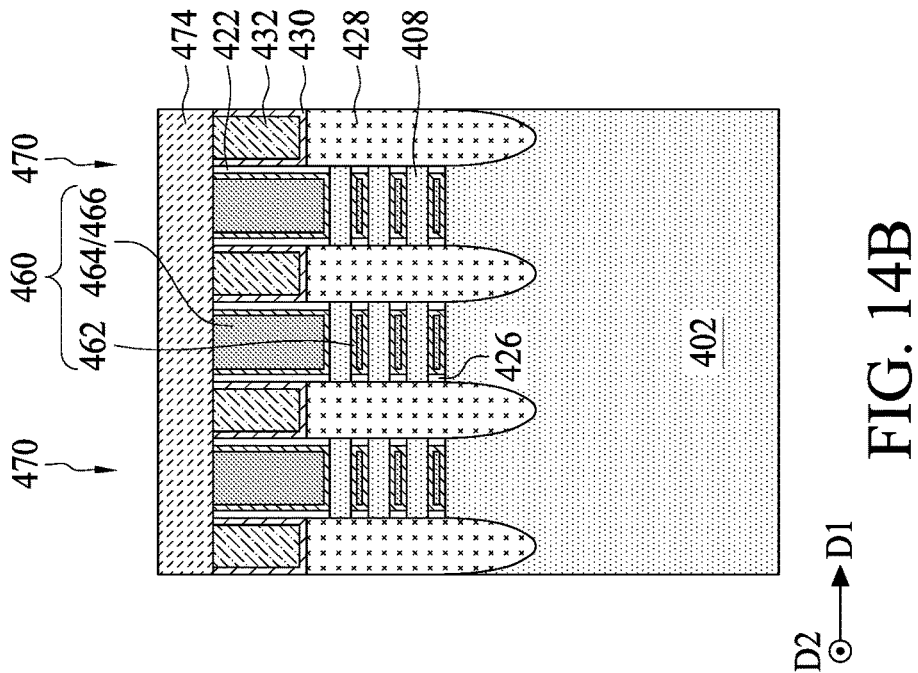
FIG. 14B is a cross-sectional view taken along line II-II' of FIG. 14C.
Figure 14A:
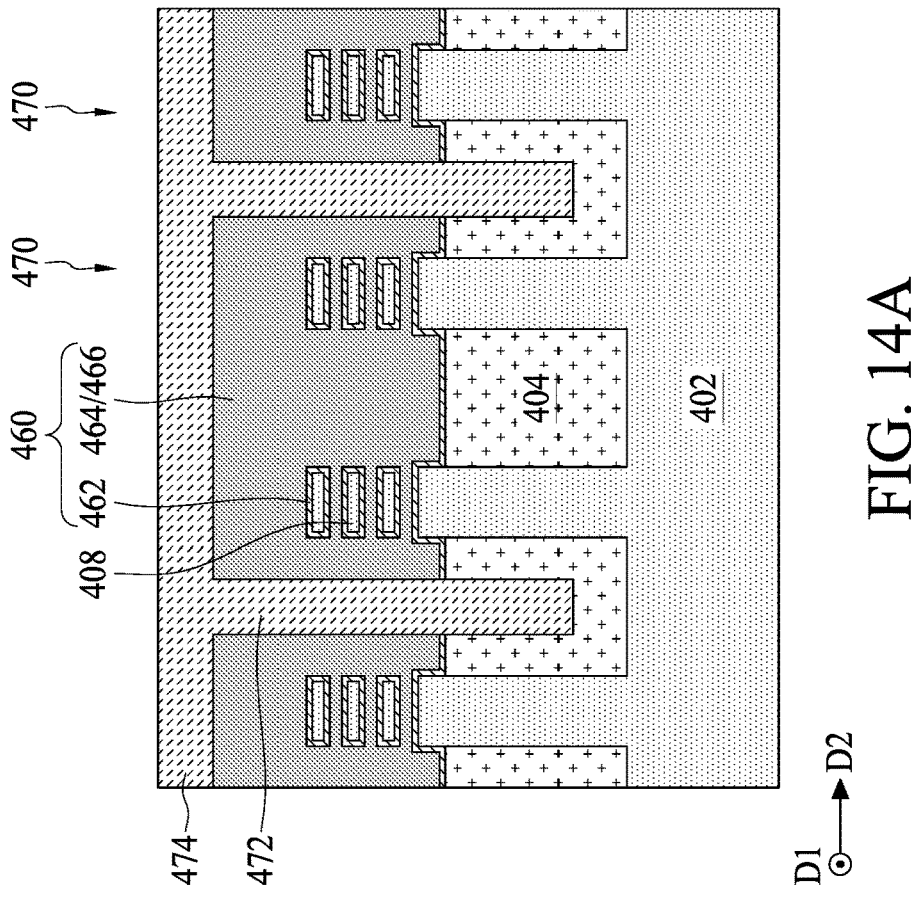
FIG. 14A is a cross-sectional view taken along line I-I' of FIG. 14C.
Figure 14C:
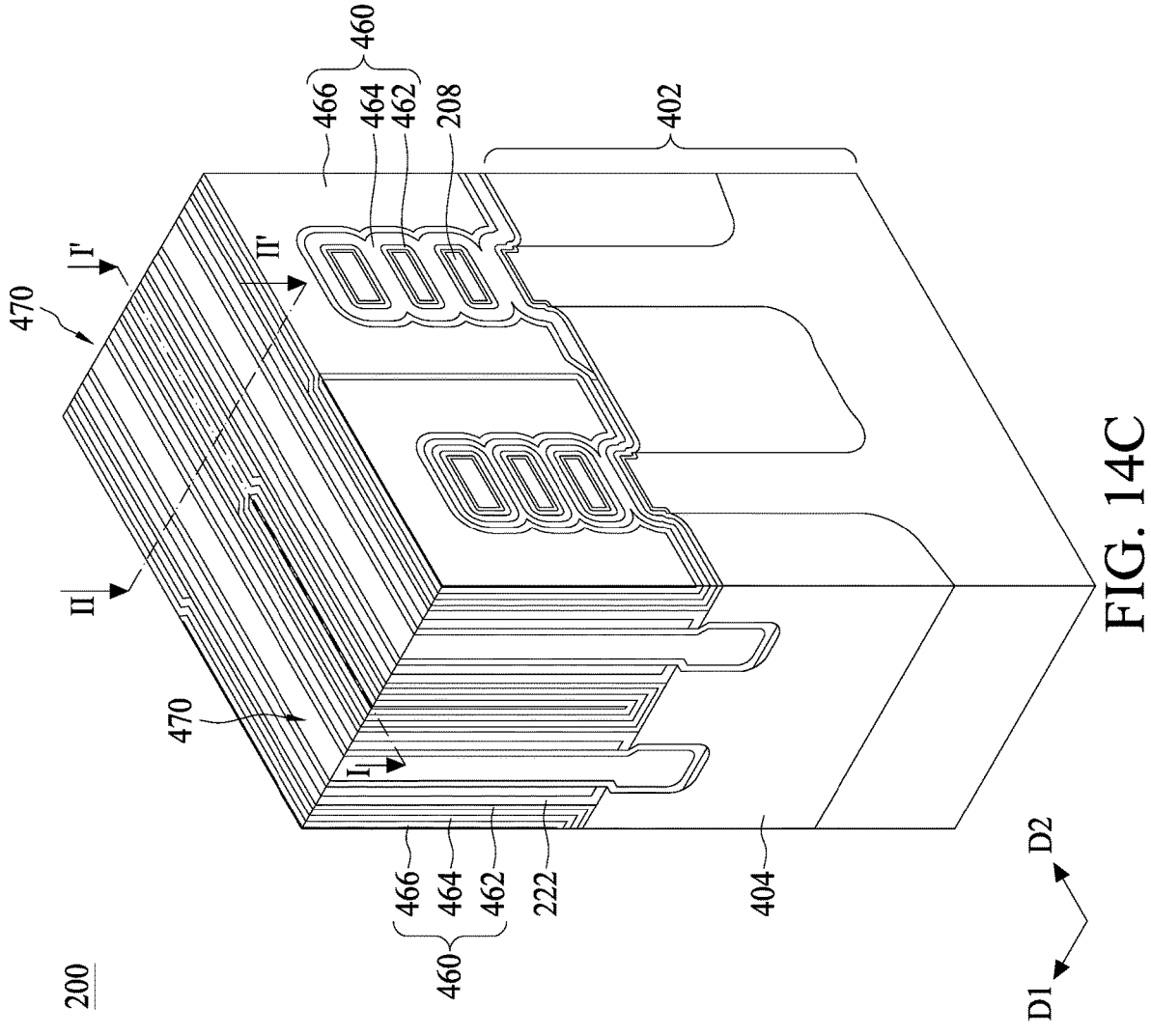
FIG. 14C is a perspective view of a semiconductor structure according to aspects of one or more embodiments of the present disclosure.

Referring to FIGS. 14A to 14C, in operation 301, a substrate 402 is received. Materials of the substrate 402 may be similar to those described above and thus repeated descriptions are omitted herein. Further, the substrate 402 may include various doping configurations depending on design requirements as is known in the art. Such details may be similar to those described above; therefore, repeated descriptions are omitted for brevity. The substrate 402 has isolations, e.g., STIs 404, interposing different regions.

In some embodiments, at least a multi-gate FET device 470 is disposed over the substrate 402. The multi-gate FET device 470 includes a plurality of nanosheets 408 stacked Over the substrate 402 and separated from each other, a metal gate structure 460 surrounding each of the nanosheets 408, and epitaxial source/drain structures 428. The multi-gate FET device 470 may further include inner spacers 426 and spacers 422.

The multi-gate FET device 470 may be formed by known operations; therefore, details are omitted herein for brevity. In some embodiments, materials for forming the nanosheets 408, the metal gate structure 460, the epitaxial source/drain structures 42$, the inner spacers 426 and the spacers 422 may be similar to those described above; therefore, repeated descriptions are omitted for brevity.

In some embodiments, the multi-gate FET device 470 may be disposed over a CESL 430 and an ILD structure 432, as shown in FIGS. 14A to MC. In some embodiments, materials for forming the CESL 430 and the ILL) structure 432 may be similar to those described above; therefore, repeated descriptions are omitted for brevity.

Referring to FIGS. 14A and 14B, in some embodiments, the metal gate structure 460 may be segmented by at least an isolation 472. In some embodiments, the isolation 472 may be referred to as a cut-poly isolation structure or a cut-metal isolation structure. Further, a protection layer 474 may be formed over the metal gate structures 460 and the isolations 472. In some embodiments, the protection layer 474 is coupled to the isolations 472, hut the disclosure is not limited thereto.

In some embodiments, the isolation 472 includes silicon nitride, but the disclosure is not limited thereto. In some embodiments, the protection layer 474 includes silicon nitride, but the disclosure is not limited thereto. The isolation 472 and the protection layer 474 may include a same material. Alternatively, the isolation 472 and the protection layer 474 include different materials.

Figure 15B:
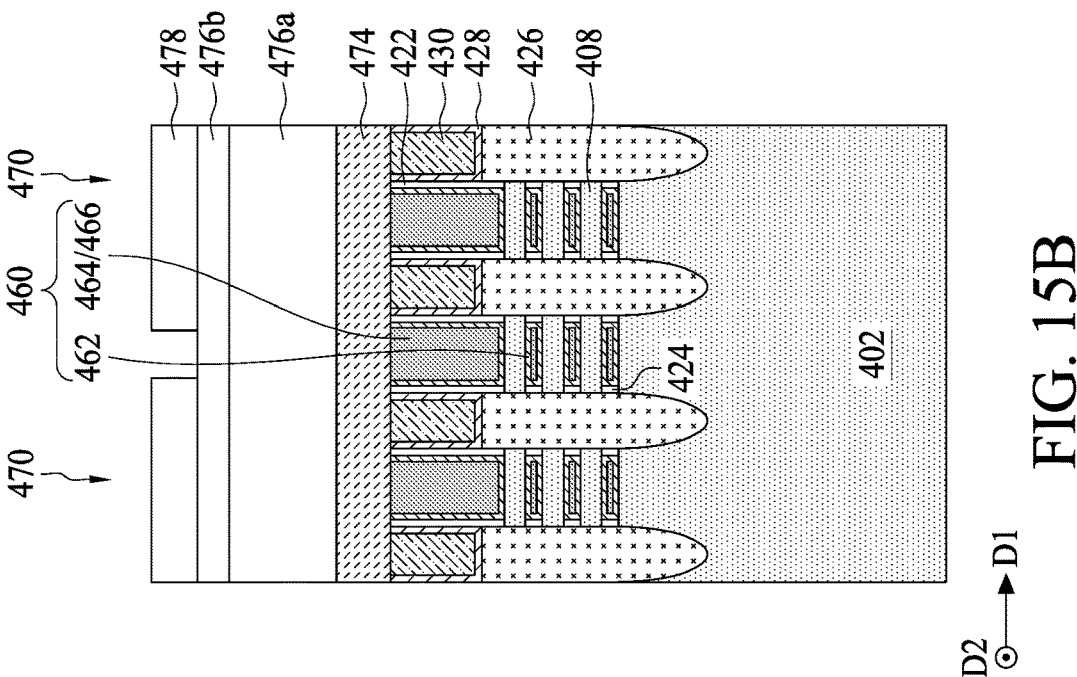
FIG. 15B is a cross-sectional view at a fabrication stage subsequent to that of FIG. 14B.
Figure 15A:
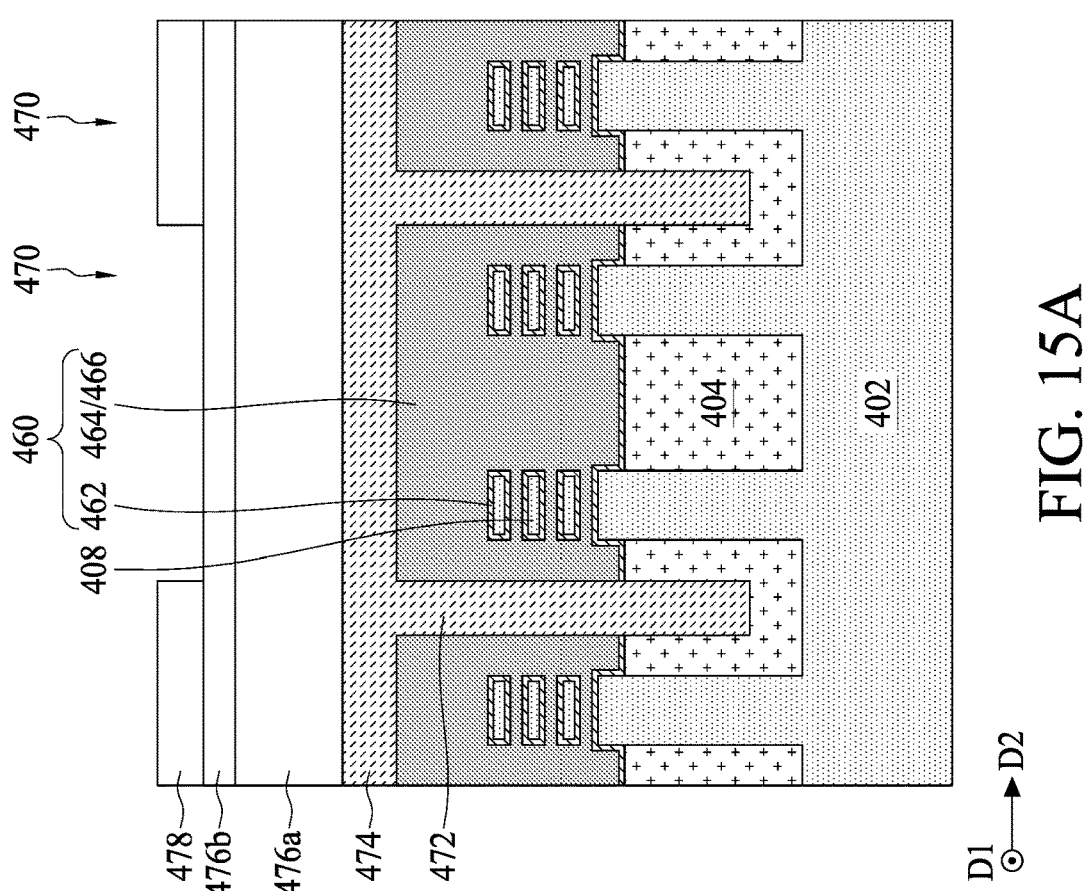
FIG. 15A is a cross-sectional view at a fabrication stage subsequent to that of FIG. 14A.

In operation 302, a portion of the metal gate structure 460 is removed to form a first recess. In some embodiments, operation 302 includes further operations. For example, a hard mask is formed over the protection layer 474. In some embodiments, the hard mask includes a multiple layered structure. Referring to FIGS. 15A and 15B, for example, the hard mask may include a first layer 476*a* and a second layer 476*b*. In some embodiments, the first layer 476*a* includes spin-on-carbon (SOC) or carbon, but the disclosure is not limited thereto. In some embodiments, the second layer 476*b* includes spin-on-glass (SOG), but the disclosure is not limited thereto. In some embodiments, a thickness of the second layer 476*b* is less than a thickness of the first layer 476*a*, but the disclosure is not limited thereto. A patterned photoresist 478 is then formed over the hard mask (i.e., the second layer 476*b*).

Figure 16B:
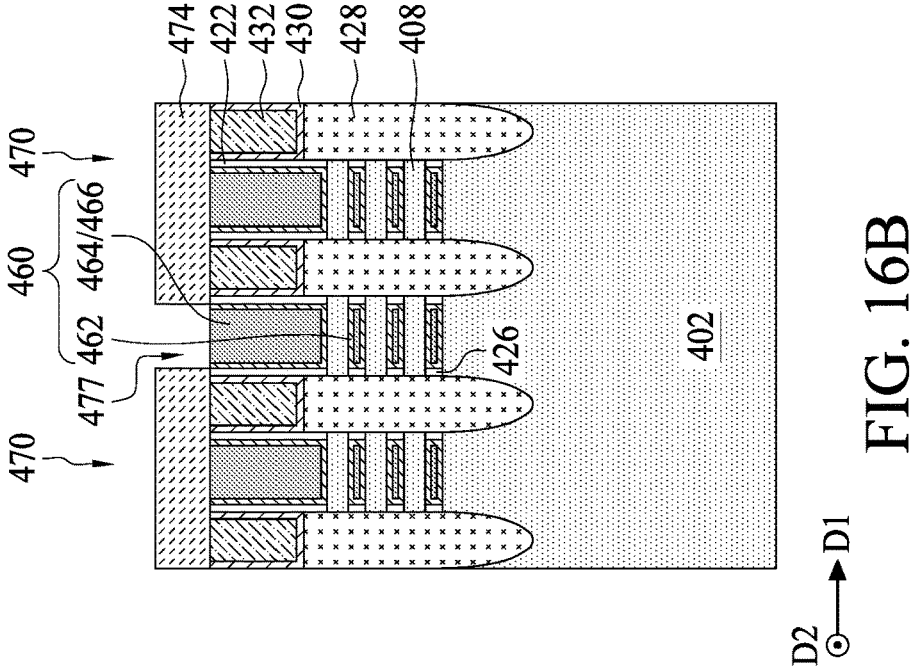
FIG. 16B is a cross-sectional view at a fabrication stage subsequent to that of FIG. 15B.
Figure 16A:
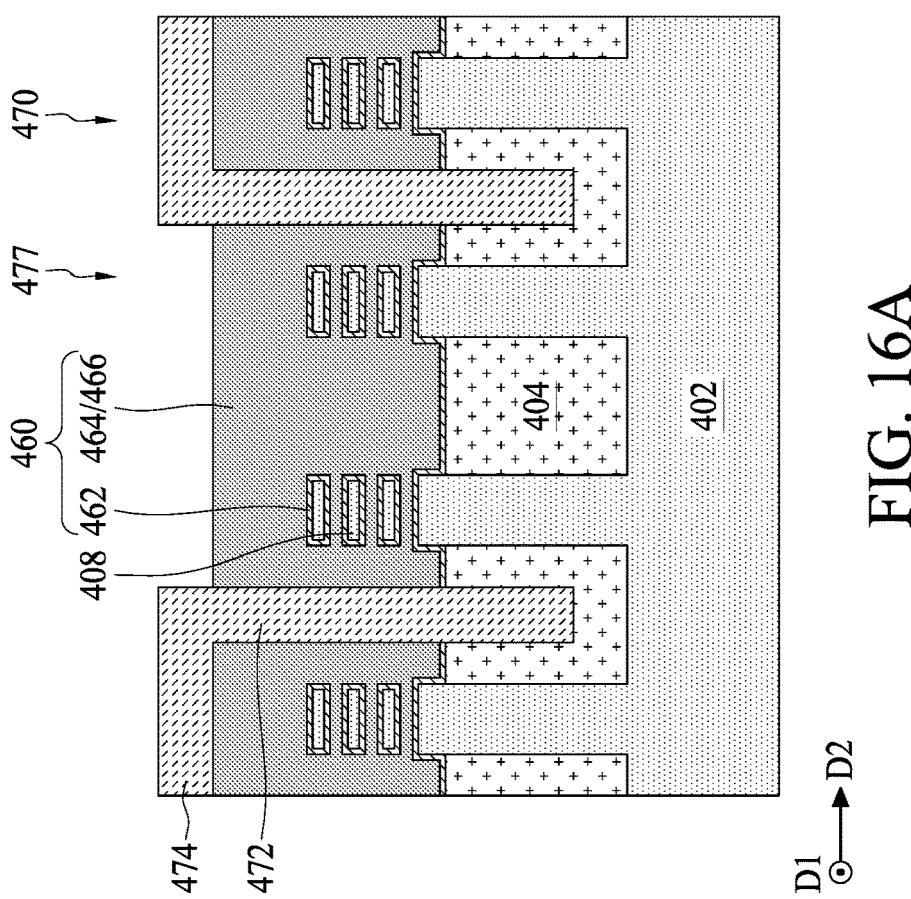
FIG. 16A is a cross-sectional view at a fabrication stage subsequent to that of FIG. 15A.

Referring to FIGS. 16A and 1613, the hard mask is patterned through the patterned photoresist 478, then the protection layer 474 is patterned through the patterned hard mask. Accordingly, an opening 477 is formed in the patterned protection layer 474. The patterned photoresist 478 and the first and second layers of the patterned hard mask 476*a* and 476*b* are removed. In some embodiments, a portion of the metal gate structure 460 is exposed through a bottom of the opening 477.

Figure 17B:
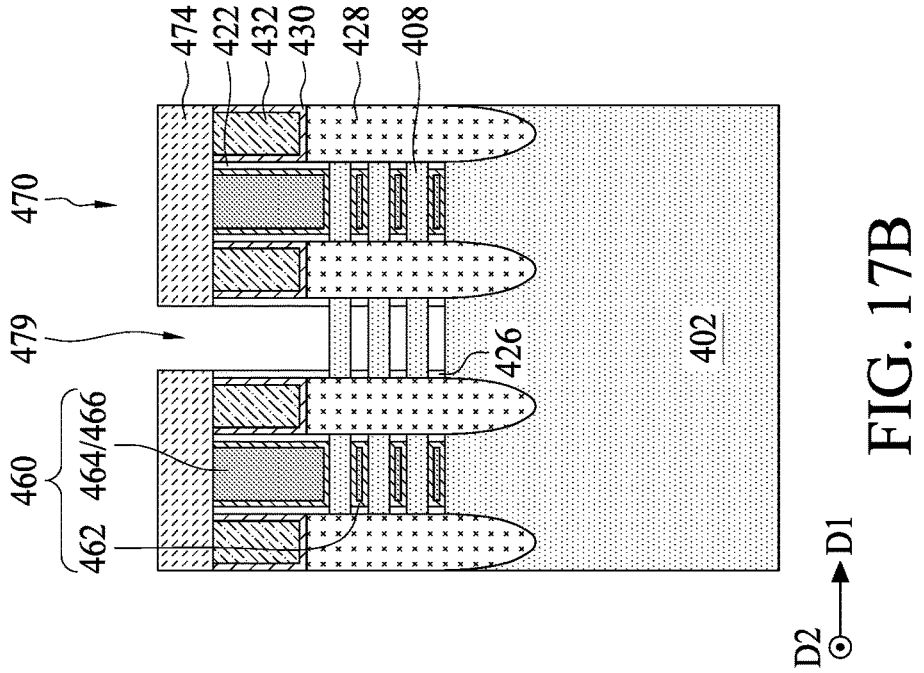
FIG. 17B is a cross-sectional view at a fabrication stage subsequent to that of FIG. 16B.
Figure 17A:
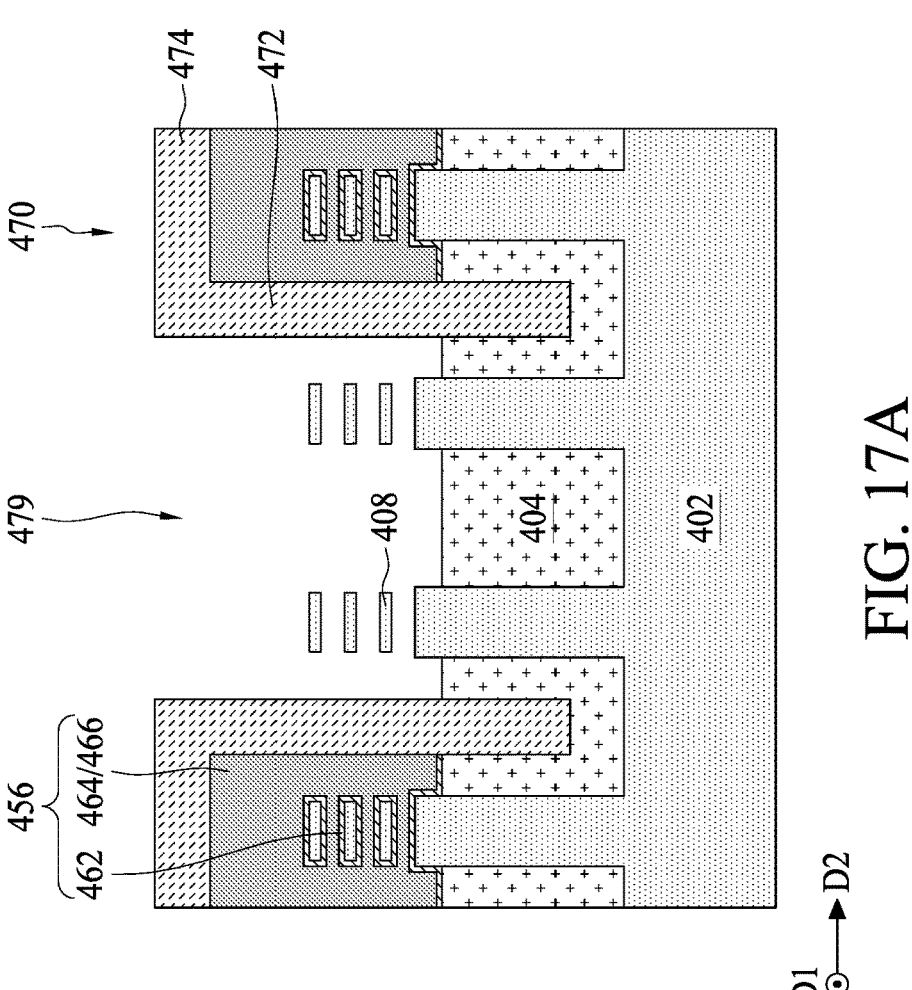
FIG. 17A is a cross-sectional view at a fabrication stage subsequent to that of FIG. 16A.

Referring to FIGS. 17A and 1713, in some embodiments, the portion of the metal gate structure 460 exposed through the opening 477 is removed to form a first recess 479. Further, portions of the nanosheets 408 are exposed through the first recess 479. In some embodiments, the isolation 472 and the spacer 422 together form sidewalls of the first recess 479, while the substrate 402 and the isolation 404 together form a bottom of the first recess 479.

Figure 18B:
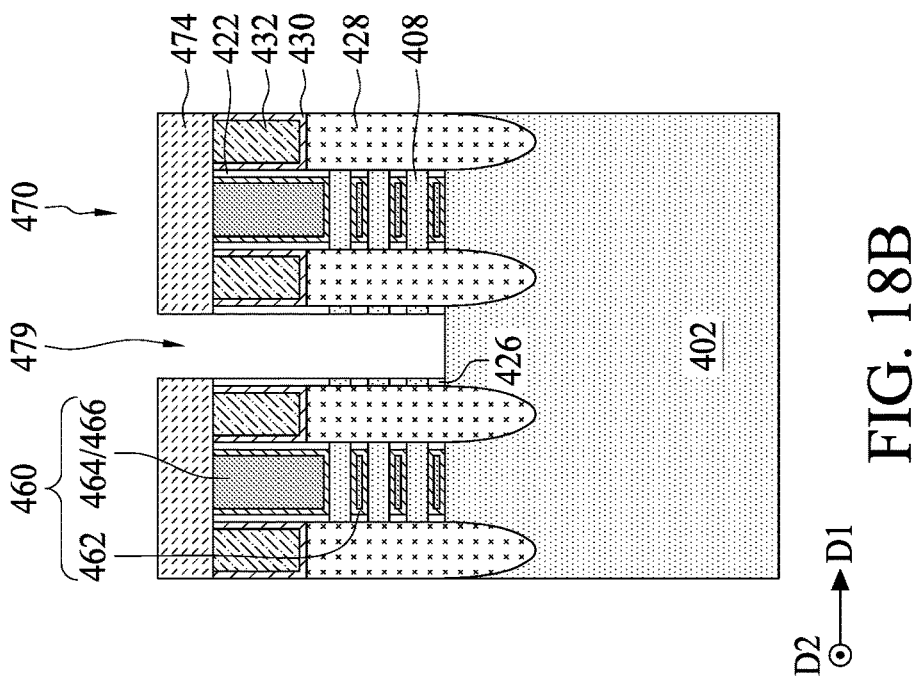
FIG. 18B is a cross-sectional view at a fabrication stage subsequent to that of FIG. 17B.
Figure 18A:
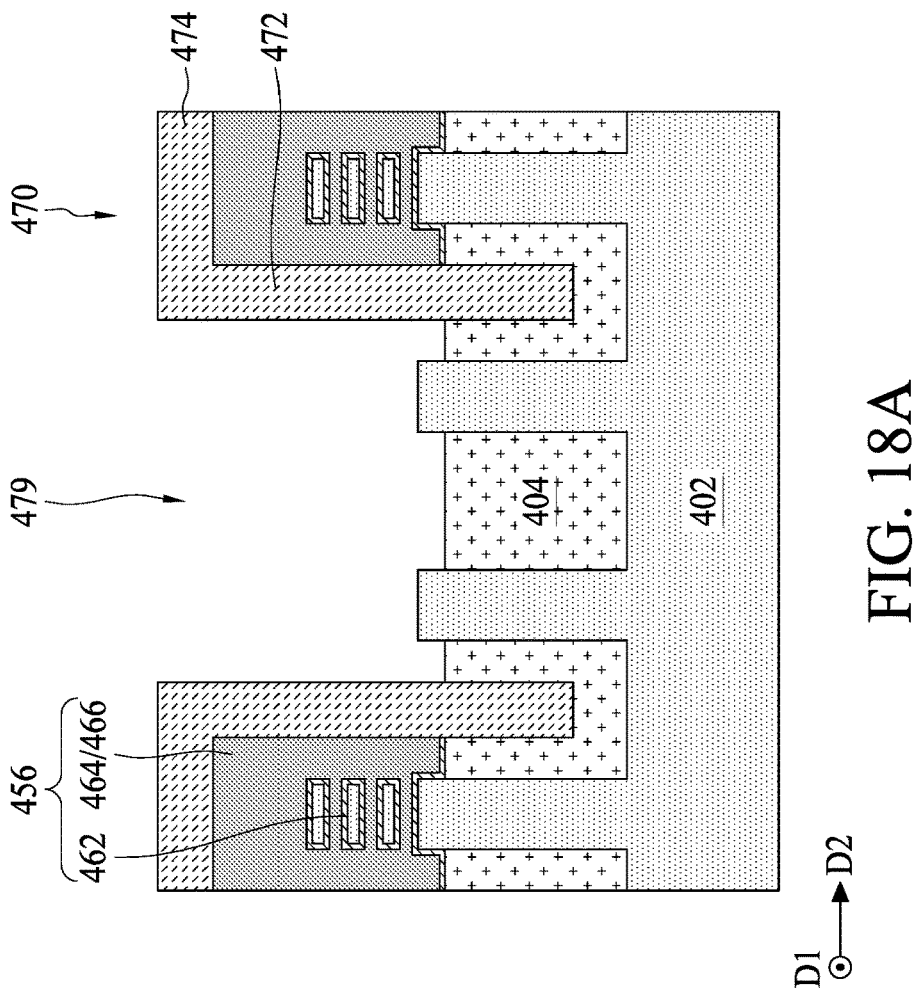
FIG. 18A is a cross-sectional view at a fabrication stage subsequent to that of FIG. 17A.

Referring to FIGS. 18A and 18B, in operation 303, the portions of the nanosheets 408 exposed through the first recess 479 are removed. In some embodiments, a bottom of the first recess 479 is higher than a bottom of the epitaxial source/drain structures 428, as shown in FIG. 18B.

Figure 19B:
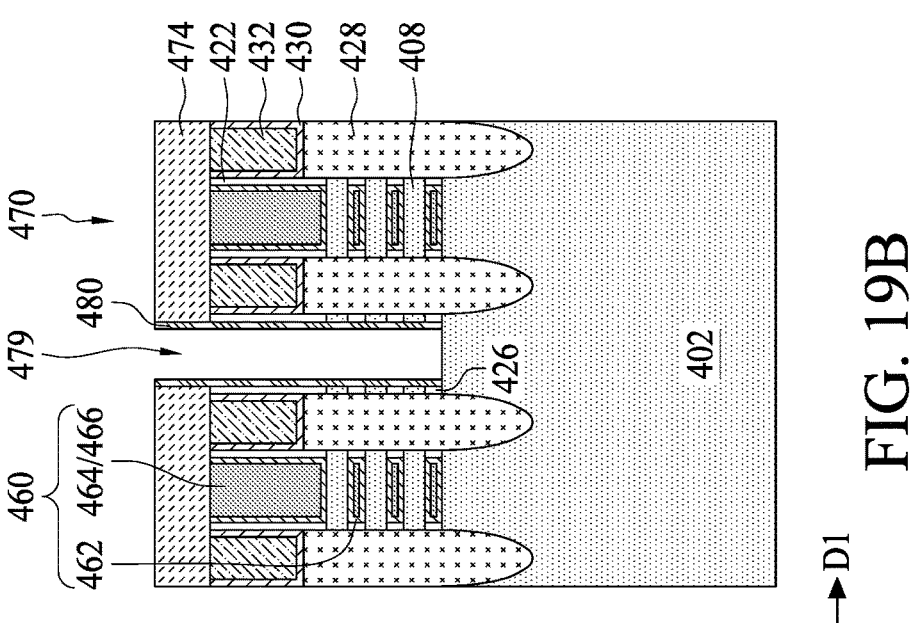
FIG. 19B is a cross-sectional view at a fabrication stage subsequent to that of FIG. 18B.
Figure 19A:
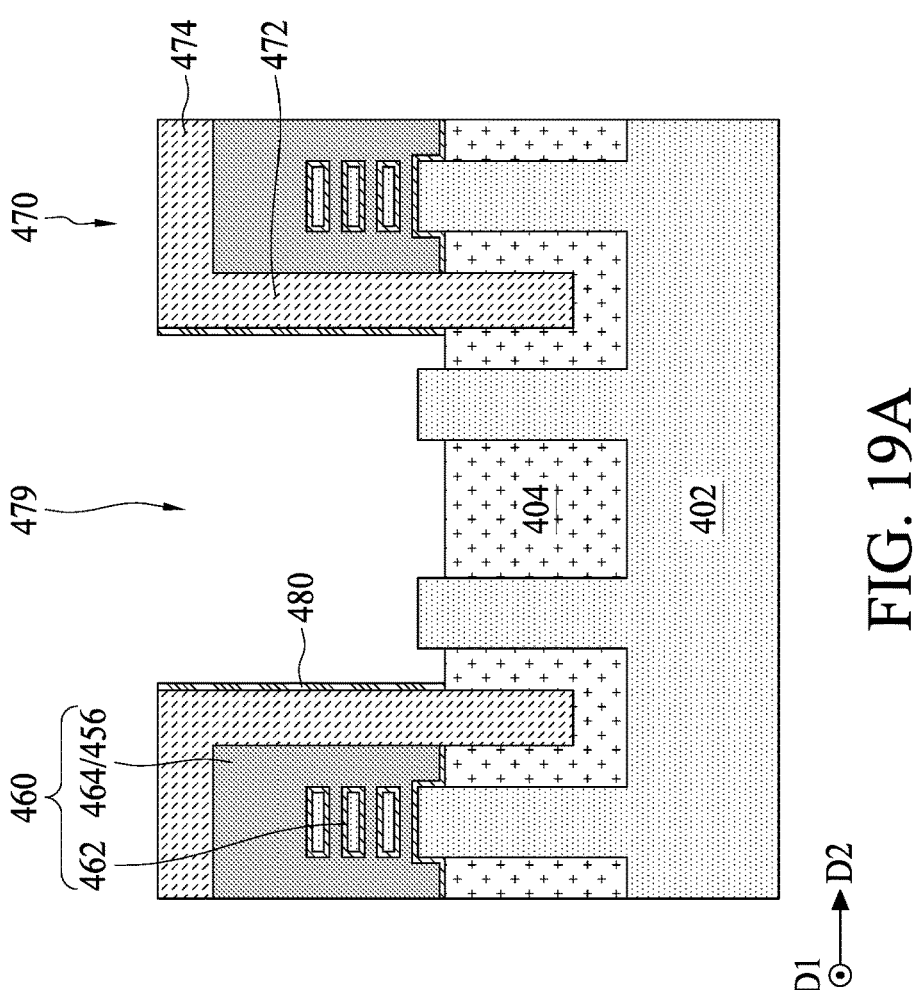
FIG. 19A is a cross-sectional view at a fabrication stage subsequent to that of FIG. 18A.

Referring to FIGS. 19A and 19B, in some embodiments, a spacer 480 may be formed over sidewalls of the first recess 479. Operations and materials for forming the spacer 480 may be similar to those for forming the spacers 240; therefore, repeated descriptions are omitted for brevity.

Figure 20B:
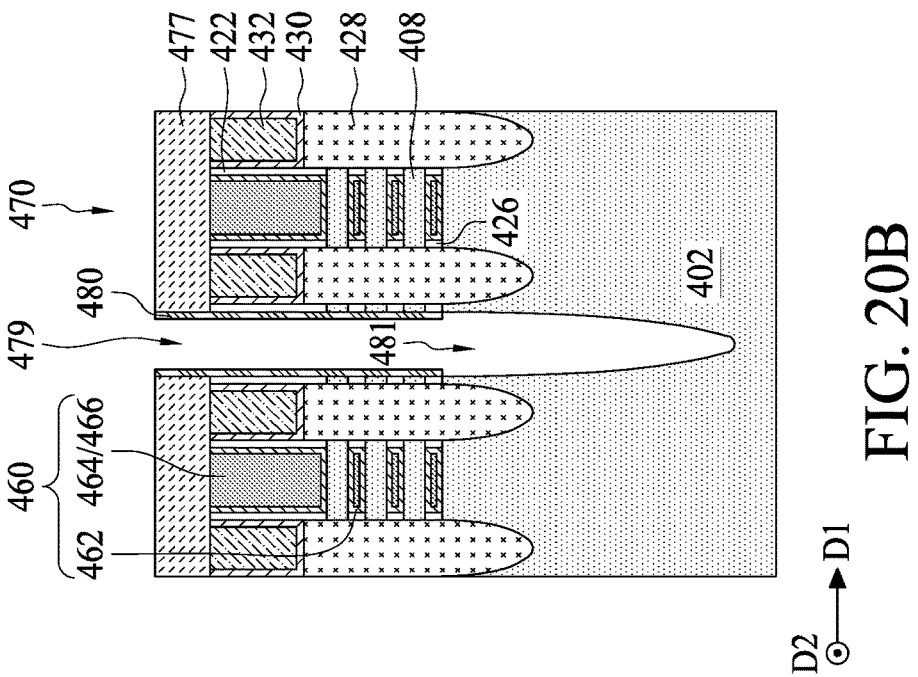
FIG. 20B is a cross-sectional view at a fabrication stage subsequent to that of FIG. 19B.
Figure 20A:
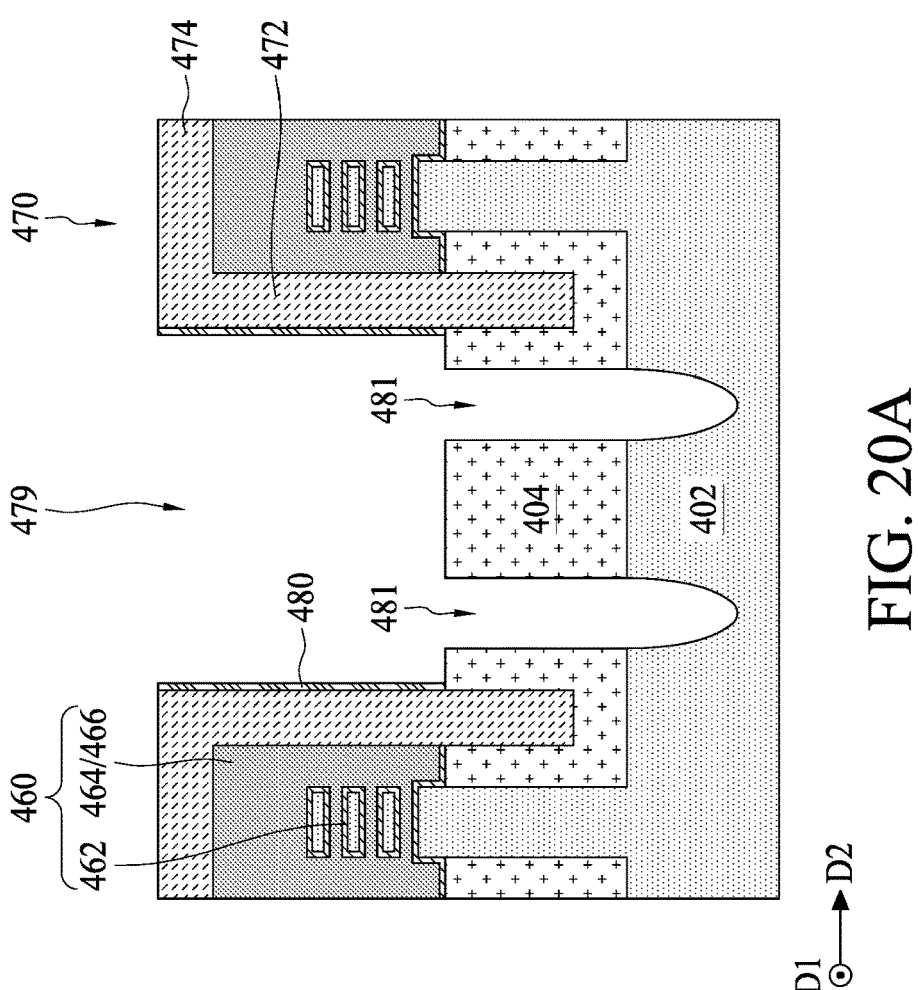
FIG. 20A is a cross-sectional view at a fabrication stage subsequent to that of FIG. 19A.

Referring to FIGS. 20A and 20B, in operation 304, a portion of the substrate 402 is removed to form a second recess 481 coupled to the first recess 479. In some embodiments, the forming of the second recess includes an anisotropic etching. In some embodiments, the etching is a dry etching operation. In some embodiments, the etching uses HBr, $O_2$ and Ar. A flow rate of HBr is between approximately 100 sccm and approximately 1,000 sccm, a flow rate of $O_2$ is less than approximately 100 sccm, and a flow rate of Ar is between approximately 100 sccm and approximately 1,000 sccm, but the disclosure is not limited thereto. In some embodiments, the etching uses an inductively coupled plasma (ICP). In such embodiments, an RF frequency of the etching is approximately 13.56 MHz or approximately 27 MHz. An operation pressure may be between approximately 3 mTorr and approximately 150 mTorr. A temperature of the etching may be between approximately 20° C. and approximately 140° C. In some embodiments, an output of an RF power generator is controlled by a pulse signal having a duty cycle in a range of approximately 20% to approximately 100%. Additionally, an RF bias power to a pedestal in the process chamber is in a range of approximately 10 W to approximately 600 W. However, the abovementioned parameters are not limited thereto. Those parameters can be changed depending on different product and/or process designs.

As shown in FIGS. 20A and 20B, a bottom of the second recess 481 is lower than the bottoms of the epitaxial source/drain structures 428. Further, the bottom of the second recess 481 is lower than a bottom of the isolation 404. In some embodiments, a width of the second recess 481 and a width of the first recess 479 are different from each other. A depth of the second recess 481 is greater than the width of the second recess 481 due to the etching operation. It should be noted that during the etching operation, the bottom of the second recess 481 is made deeper than the isolation 404, however, less materials of sidewalls are consumed. Therefore, the epitaxial source/drain structures 428 are separated from the second recess 481. Further, the sidewalls of the first recess 479 are protected by the spacers 480. Therefore, the epitaxial source/drain structures 428 are protected from the etching.

After the forming of the second recess 481, a cleaning operation may be performed. The cleaning operation may use diluted hydrogen fluoride (dHF). The cleaning operation is performed to remove residues and/or by-products left from the forming of the second recess 481. In some embodiments, the spacer 480 is removed using the cleaning operation.

Figure 21B:
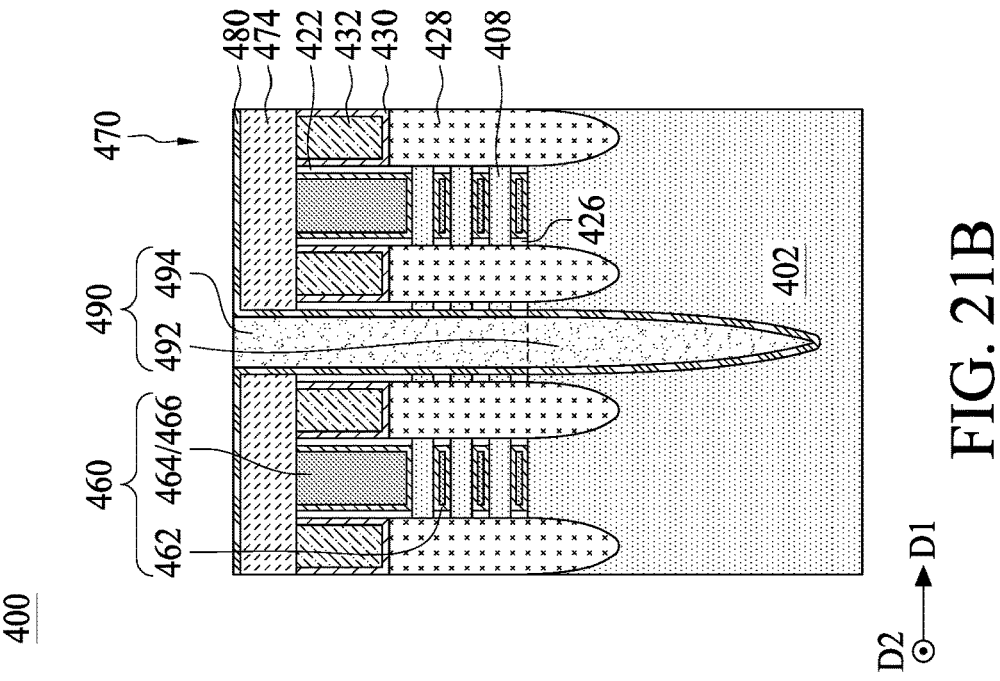
FIG. 21B is a cross-sectional view at a fabrication stage subsequent to that of FIG. 20B.
Figure 21A:
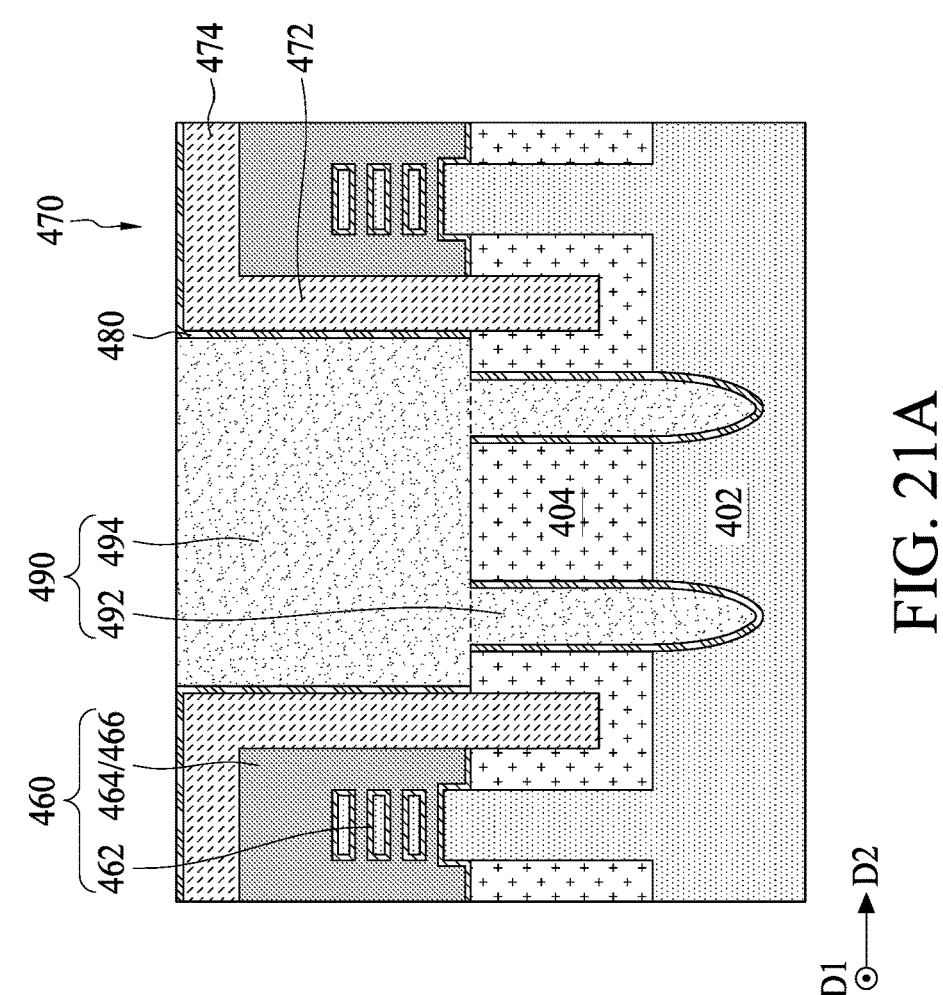
FIG. 21A is a cross-sectional view at a fabrication stage subsequent to that of FIG. 20A.

Referring to FIGS. 21A and 21B, in operation 305, the second recess 481 and the first recess 479 are filled with an insulating material to form an isolation 490. In some embodiments, the insulating material may include silicon oxide, but the disclosure is not limited thereto. In some embodiments, the isolation 490 includes two portions: a first portion 492 fillip the second recess 481 and a second portion 494 filling the first recess 479. The first portion 492 and the second portion 494 are coupled. As shown in FIGS. 21A and 21B, a bottom of the first portion 492 is lower than the bottom of the isolation 404 and the bottoms of the epitaxial source/drain structures 428. Further, the bottoms of the epitaxial source/drain structures 428 are between the bottom of the first portion 492 and a bottom of the second portion 494. A top surface of the second portion 494 is aligned with a top surface of the metal gate structure 460.

As mentioned above, the widths of the first and second recesses 479 and 481 are different from each other. Therefore, widths of the first and second portions 492 and 494 of the isolation 490 are different from each other. For example, the width of the first portion 492 is less than the width of the second portion 494. In some embodiments, the bottom and a lower portion of sidewalls of the first portion 492 are in contact with the substrate 402, while an upper portion of the sidewalls of the first portion 492 is in contact with the isolation 404.

Accordingly, a semiconductor structure 400 is obtained. The semiconductor structure 400 includes a substrate 402, an isolation 404 disposed in the substrate 402, multi-gate field effect transistor (FET) devices 470 disposed over the substrate 402, and an isolation 490 disposed in and over the substrate 402. The multi-gate FET device 470 includes a metal gate structure 460, a plurality of nanosheets 408 and epitaxial source/drain structures 428. The nanosheets 408 are stacked over the substrate 402 and separated from each other by the metal gate structure 460, as shown in FIG. 21B.

The isolation 490 includes a first portion 492 and a second portion 494. As mentioned above, a width of the second portion 494 is different from a width of the first portion 492, as shown in FIGS. 21A and 21B. A bottom of the first portion 492 of the isolation 490 is lower than a bottom of the isolation 404 and bottoms of the epitaxial source/drain structures 428. Further, the bottoms of the epitaxial source/drain structures 428 are between the bottom of the first portion 492 and a bottom of the second portion 494 of the isolation 490.

As mentioned above, the bottom of the first portion 492 of the isolation 490 is lower than the bottom of the isolation 404 and the bottoms of the epitaxial source/drain structures 428. In other words, a depth of the first portion 492 of the isolation 490 is great enough to penetrate well regions (not shown) formed in the substrate 402. Therefore, the first portion 492 provides sufficient electrical isolation and thus a leakage issue of the semiconductor structure 400 is mitigated. Further, due to an anisotropic etching used to form a second recess 481, the second recess 481 obtains a large depth-to-width ratio with less consumption of its sidewall materials. Thus, damage to the epitaxial source/drain structures 428 is mitigated.

It will be appreciated that in the foregoing method, a recess profile of a cut-OD process is modified in order to mitigate a leakage issue and reduce damage to an epitaxial material. In some embodiments, a spacer is provided to help control the recess profile formed by the cut-OD operation. The spacer further helps to protect the epitaxial material during the cut-OD operation. In some embodiments, the method provides an anisotropic etching to form a recess interrupting a well region. Such anisotropic etching helps to form the recess having a desired depth with less consumption of sidewall materials. Accordingly, the leakage issue and the damage to the epitaxial material are both mitigated in a semiconductor structure formed by the method.

According to one embodiment of the present disclosure, a semiconductor structure is provided. The semiconductor structure includes a substrate, a multi-gate FET device disposed over the substrate, a first isolation disposed in the substrate, and a second isolation disposed in the substrate. The multi-gate FET device includes a gate structure and epitaxial source/drain structures disposed at two sides of the gate structure. The first isolation includes a first portion and a second portion over the first portion. A top surface of the second portion is aligned with a top surface of the epitaxial source/drain structures. A width of the second portion is different from a width of the first portion.

According to one embodiment of the present disclosure, a method for forming a semiconductor structure is provided. The method includes following operations. A nanosheet stack is formed over a substrate. The nanosheet stack includes a plurality of nanosheets separated from each other. A sacrificial gate structure is formed over the nanosheet stack. Epitaxial source/drain structures are formed at two sides of the sacrificial gate structure. A portion of the sacrificial gate structure is removed to form a first recess. The nanosheet stack is exposed through the first recess. Portions of the nanosheet stack are removed to form a second recess coupled to the first recess. Spacers are formed over sidewalk of the first recess and sidewalls of the second recess. A portion of the substrate is removed to form at third recess coupled to the second recess. The third recess, the second recess and the first recess are filled to form a first isolation.

According to one embodiment of the present disclosure, a method for forming a semiconductor structure is provided.

The method includes following operations. A substrate is received. At least a multi-gate FET device is disposed over the substrate. The multi-gate FET device includes a plurality of nanosheets stacked over the substrate and separated from each other, a metal gate structure surrounding each of the nanosheets, and epitaxial source/drain structures. A portion of the metal gate structure is removed to form a first recess. Portions of the nanosheets are exposed through the first recess. The portions of the nanosheets exposed through the first recess are removed. A portion of the substrate is removed to form a second recess coupled to the first recess. The second recess and the first recess are filled to form a first isolation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a nanosheet stack over a substrate, wherein the nanosheet stack comprises a plurality of nanosheets;
   forming a sacrificial gate structure over the nanosheet stack;
   forming epitaxial source/drain structures at two sides of the sacrificial gate structure;
   removing a portion of the sacrificial gate structure to form a first recess exposing the nanosheet stack after the forming of the epitaxial source/drain structures;
   removing portions of the nanosheet stack to form a second recess coupled to the first recess;
   forming spacers on sidewalls of the first recess and sidewalls of the second recess after the forming of the epitaxial source/drain structures;
   removing a portion of the substrate to form a third recess coupled to the second recess; and
   filling the third recess, the second recess and the first recess to form a first isolation.

2. The method of claim 1, wherein a bottom of the second recess is higher than bottoms of the epitaxial source/drain structures.

3. The method of claim 1, wherein the substrate comprises a second isolation, and a bottom of the third recess is lower than a bottom of the second isolation.

4. The method of claim 1, wherein the forming of the third recess comprises an anisotropic etching operation.

5. The method of claim 1, further comprising removing the spacers.

6. The method of claim 1, further comprising:
   removing portions of the nanosheet stack to form the plurality of nanosheets; and
   replacing the sacrificial gate structure with a metal gate structure.

7. A method for forming a semiconductor structure, comprising:
   forming a nanosheet stack extending a first direction over a substrate, wherein the nanosheet stack comprises a plurality of nanosheets;

forming a sacrificial gate structure extending a second direction over the nanosheet stack, wherein the second direction is different from the first direction;

forming epitaxial source/drain structures at two sides of the sacrificial gate structure;

forming a first isolation in the sacrificial gate structure, the nanosheet stack and the substrate; and replacing the sacrificial gate structure with a metal gate structure, wherein, in the second direction, the first isolation comprises a first portion laterally surrounded by the substrate, a second portion laterally surrounded by the epitaxial source/drain structures, and a third portion surrounded by the metal gate structure, wherein a bottom of the second portion is in direct contact with the first portion, and a top of the second portion is in direct contact with the third portion, wherein, in the second direction, a width of the third portion is greater than a width of the first portion.

8. The method of claim 7, wherein the substrate comprises a second isolation, and the second isolation is exposed through a sidewall of the third recess.

9. The method of claim 8, wherein a bottom of the third recess is lower than a bottom of the second isolation.

10. The method of claim 7, further comprising removing the spacers prior to the filling of the third recess, the second recess and the first recess with the insulating material to form the first isolation.

11. The method of claim 7, further comprising:

removing portions of the nanosheet stack to form the plurality of nanosheets; and replacing the sacrificial gate structure with a metal gate structure.

12. The method of claim 11, further comprising forming a third isolation in the metal gate structure.

13. The method of claim 12, wherein a bottom of the third isolation is higher than a bottom of the first isolation.

14. The method of claim 12, further comprising forming a protection layer over the third isolation.

15. The method of claim 14, wherein the protection layer and the third isolation comprise a same material.

16. The method of claim 14, wherein the protection layer is coupled to the third isolation.

17. A method for forming a semiconductor structure, comprising:

forming a nanosheet stack extending a first direction over a substrate, wherein the nanosheet stack comprises a plurality of nanosheets;

forming a sacrificial gate structure extending a second direction over the nanosheet stack, wherein the second direction is different from the first direction;

forming epitaxial source/drain structures at two sides of the sacrificial gate structure;

forming a first isolation in the sacrificial gate structure, the nanosheet stack and the substrate; and replacing the sacrificial gate structure with a metal gate structure, wherein, in the second direction, the first isolation comprises a first portion laterally surrounded by the substrate, a second portion laterally surrounded by the epitaxial source/drain structures, and a third portion surrounded by the metal gate structure, wherein a bottom of the second portion is in contact with the first portion, and a top of the second portion is in contact with the third portion, wherein, in the second direction, a width of the third portion is greater than a width of the first portion.

18. The method of claim 17, wherein a width of the second portion is different from the width of the first portion, and different from the width of the third portion.

19. The method of claim 17, wherein the substrate comprises a second isolation, and a bottom of the first isolation is lower than a bottom of the second isolation.

20. The method of claim 19, wherein the first portion of the first isolation is laterally surrounded by the second isolation in the first direction.

* * * * *